(12) United States Patent
Kovvuri et al.

(10) Patent No.: US 12,093,865 B1
(45) Date of Patent: Sep. 17, 2024

(54) SYSTEM AND METHOD OF DISCRETE PLANNING FOR PROCESS INDUSTRY

(71) Applicant: Blue Yonder Group, Inc., Scottsdale, AZ (US)

(72) Inventors: Raja Sekhar Kovvuri, Bangalore (IN); Vikash Jalan, Howrah (IN); Nimish Bhatnagar, Bangalore (IN); Aakash Garg, Bangalore (IN)

(73) Assignee: Blue Yonder Group, Inc., Scottsdale, AZ (US)

( * ) Notice: Subject to any disclaimer, the term of this patent is extended or adjusted under 35 U.S.C. 154(b) by 360 days.

(21) Appl. No.: 17/331,134

(22) Filed: May 26, 2021

Related U.S. Application Data

(60) Provisional application No. 63/030,654, filed on May 27, 2020.

(51) Int. Cl.
    *G06Q 10/0631*     (2023.01)
    *G06F 16/28*     (2019.01)
    *G06F 30/20*     (2020.01)

(52) U.S. Cl.
    CPC ..... *G06Q 10/06315* (2013.01); *G06F 16/285* (2019.01); *G06F 30/20* (2020.01)

(58) Field of Classification Search
    USPC .............................................. 705/7.11–7.42
    See application file for complete search history.

(56) References Cited

U.S. PATENT DOCUMENTS

| | | | | |
|---|---|---|---|---|
| 4,737,910 A | * | 4/1988 | Kimbrow | G06Q 10/087 377/13 |
| 7,065,463 B2 | * | 6/2006 | Zhang | G06Q 10/087 702/101 |
| 8,494,892 B2 | * | 7/2013 | Salomon | G06Q 10/107 705/28 |
| 2002/0188499 A1 | * | 12/2002 | Jenkins | G06Q 10/087 705/28 |
| 2004/0153190 A1 | * | 8/2004 | Zhang | G06Q 10/087 700/106 |
| 2007/0255626 A1 | * | 11/2007 | Salomon | G06Q 30/0601 705/26.1 |

(Continued)

OTHER PUBLICATIONS

Chatras, Clement, Vincent Giard, and Mustapha Sali. "Mass customisation impact on bill of materials structure and master production schedule development." International Journal of Production Research 54.18 (2016): 5634-5650. (Year: 2016).*

(Continued)

*Primary Examiner* — Alan S Miller
(74) *Attorney, Agent, or Firm* — Spencer Fane LLP; Steven J. Laureanti

(57) ABSTRACT

A system and method of supply chain planning of process industry production include a processor and memory and are configured to model a supply chain planning problem for two or more products of a process industry, wherein a coproduct is produced for at least one of the products, group the two or more products into groups, receive a weight and a yield for each raw material that produces each of the products in at least one of the groups, cluster each of the raw materials using weight-yield clustering, generate BOM grouping, and assign one BOM grouping to each of the raw materials of a single cluster.

20 Claims, 15 Drawing Sheets

(56) References Cited

U.S. PATENT DOCUMENTS

| | | | | |
|---|---|---|---|---|
| 2009/0241022 A1* | 9/2009 | Chang | .................... | G06Q 10/06 |
| | | | | 715/271 |
| 2010/0332008 A1* | 12/2010 | Knipfer | .................. | G09B 25/02 |
| | | | | 700/103 |
| 2015/0058052 A1* | 2/2015 | Kohlhoff | ............ | G06Q 10/0631 |
| | | | | 705/29 |
| 2016/0019321 A1* | 1/2016 | Zahner | .................... | G06F 30/13 |
| | | | | 703/1 |
| 2022/0163951 A1* | 5/2022 | Brooks | ............ | G05B 19/41875 |

OTHER PUBLICATIONS

Kashkoush, Mohamed, and Hoda ElMaraghy. "Product family formation by matching Bill-of-Materials trees." CIRP Journal of Manufacturing Science and Technology 12 (2016): 1-13. (Year: 2016).*

* cited by examiner

| PLANNING ITEM | GROUPING_ITEM_CODE | GROUP | MIN WT | MAX WT | MIN YIELD | MAX YIELD | PART TYPE | PART GROUP | CLUSTER-NO |
|---|---|---|---|---|---|---|---|---|---|
| AA23030670 | MEDIUM_DICE2_MG16_S_GEN_5 | MEDIUM_DICE2 | 1.68 | 2.09 | 33 | 66 | MG16 | SBB DICE | |
| BB23030653 | MEDIUM_DICE2_MG16_S_GEN_5 | MEDIUM_DICE2 | 1.68 | 2.09 | 33 | 66 | MG16 | SBB DICE | |
| AA23030656 | MEDIUM_DICE2_MG16_S_GEN_5 | MEDIUM_DICE2 | 1.68 | 2.09 | 33 | 66 | MG16 | SBB DICE | 1 |
| CC23030668 | MEDIUM_DICE2_MG16_S_GEN_5 | MEDIUM_DICE2 | 1.68 | 2.09 | 33 | 66 | MG16 | SBB DICE | |
| BB23030659 | MEDIUM_DICE2_MG16_S_GEN_5 | MEDIUM_DICE2 | 1.68 | 2.09 | 33 | 66 | MG16 | SBB DICE | |
| EE23030661 | MEDIUM_DICE2_MG16_S_GEN_5 | MEDIUM_DICE2 | 1.68 | 2.09 | 33 | 66 | MG16 | SBB DICE | |
| AA23077827 | MEDIUM_DICE2_MG44_S_NOR_2 | MEDIUM_DICE2 | 1.68 | 2.09 | 33 | 66 | MG44 | SBL DICE | 2 |
| CC23082333 | SMALL_STRIP2_MG14_S_GEN_5 | SMALL_STRIP2 | 0 | 4.67 | 33 | 66 | MG14 | SBB STRIP | |
| EE23030706 | SMALL_STRIP2_MG14_S_GEN_5 | SMALL_STRIP2 | 0 | 4.67 | 33 | 66 | MG14 | SBB STRIP | 3 |
| FF23030694 | SMALL_STRIP2_MG14_S_GEN_5 | SMALL_STRIP2 | 0 | 4.67 | 33 | 66 | MG14 | SBB STRIP | |
| AA23030689 | SMALL_STRIP2_MG14_S_GEN_5 | SMALL_STRIP2 | 0 | 4.67 | 33 | 66 | MG14 | SBB STRIP | |
| BB23076047 | SMALL_STRIP2_MG14_S_GEN_5 | SMALL_STRIP2 | 0 | 4.67 | 33 | 66 | MG14 | SBB STRIP | |
| AA23055896 | SMALL_STRIP2_MG33_S_NOR_5 | SMALL_STRIP2 | 0 | 4.67 | 33 | 66 | MG33 | BL STRIP | 4 |
| BB23055894 | SMALL_STRIP2_MG33_S_NOR_5 | SMALL_STRIP2 | 0 | 4.67 | 33 | 66 | MG33 | BL STRIP | |
| CC23031154 | SMALL_STRIP2_MG42_S_NOR_5 | SMALL_STRIP2 | 0 | 4.67 | 33 | 66 | MG42 | SBL STRIP | |
| AA23048895 | SMALL_STRIP2_MG42_S_NOR_5 | SMALL_STRIP2 | 0 | 4.67 | 33 | 66 | MG42 | SBL STRIP | 5 |
| BB23048897 | SMALL_STRIP2_MG42_S_NOR_5 | SMALL_STRIP2 | 0 | 4.67 | 33 | 66 | MG42 | SBL STRIP | |
| AA23029511 | SMALL_STRIP2_MG54_S_GEN_5 | SMALL_STRIP2 | 0 | 4.67 | 33 | 66 | MG54 | SM STRIP | 6 |

FIG. 6

| 902 PACKAGED FG | 904 INTERMEDIATE FG | 906 LENGTH | 908 WIDTH | 910 THICKNESS | 912 WEIGHT | 914 WEIGHT COMPUTATION | 916 MISSING DIMENSION | 918 TYPE | 920 CLASSIFICATION |
|---|---|---|---|---|---|---|---|---|---|
| PKG_FG11 | FG11 | x1 | y1 | z1 | w1 | w1 | | NUGGET | S |
| PKG_FG12 | FG12 | x2 | y2 | z2 | w2 | w2 | | NUGGET | M |
| PKG_FG13 | FG13 | x3 | y3 | z3 | w3 | w3 | | NUGGET | L |
| PKG_FG14 | FG14 | x4 | y4 | z4 | | x4*y4*z4*D | | NUGGET | S |
| PKG_FG15 | FG15 | x5 | y5 | z5 | | x5*y5*z5*D | | NUGGET | M |
| PKG_FG16 | FG16 | x6 | y6 | z6 | | x6*y6*z6*D | | NUGGET | L |
| PKG_FG17 | FG17 | x7 | y7 | z7 | | x7*y7*z7*D | EXTRAPOLATE AND GET z7 | NUGGET | S |
| PKG_FG18 | FG18 | x8 | y8 | z8 | | x8*y8*z8*D | EXTRAPOLATE AND GET z8 | NUGGET | M |
| PKG_FG19 | FG19 | x9 | y9 | z9 | | x9*y9*z9*D | EXTRAPOLATE AND GET z9 | NUGGET | L |
| PKG_FG20 | FG20 | x10 | y10 | z10 | | x10*y10*z10*D | EXTRAPOLATE AND GET y10 | NUGGET | S |
| PKG_FG21 | FG21 | x11 | y11 | z11 | | x11*y11*z11*D | EXTRAPOLATE AND GET y11 | NUGGET | M |
| PKG_FG22 | FG22 | x12 | y12 | z12 | | x12*y12*z12*D | EXTRAPOLATE AND GET y12 AND z12 | NUGGET | L |

| | RAW MATERIAL | WEIGHT (W) | YIELD (Y) |
|---|---|---|---|
| 1002aa | R1 | w1 | y1 |
| 1002ab | R2 | w2 | y2 |
| 1002ac | R3 | w3 | y3 |
| 1002ad | R4 | w4 | y4 |
| 1002ae | R5 | w5 | y5 |
| 1002af | R6 | w6 | y6 |
| 1002ag | R7 | w7 | y7 |
| 1002ah | R8 | w8 | y8 |
| 1002ai | R9 | w9 | y9 |
| 1002aj | R10 | w10 | y10 |
| 1002ak | R11 | w11 | y11 |
| 1002al | R12 | w12 | y12 |
| 1002am | R13 | w13 | y13 |
| 1002an | R14 | w14 | y14 |
| 1002ao | R15 | w15 | y15 |
| 1002ap | R16 | w16 | y16 |
| 1002aq | R17 | w17 | y17 |
| 1002ar | R18 | w18 | y18 |
| 1002as | R19 | w19 | y19 |
| 1002at | R20 | w20 | y20 |
| 1002au | R21 | w21 | y21 |
| 1002av | R22 | w22 | y22 |
| 1002aw | R23 | w23 | y23 |
| 1002ax | R24 | w24 | y24 |
| 1002ay | R25 | w25 | y25 |
| 1002az | R26 | w26 | y26 |
| 1002ba | R27 | w27 | y27 |
| 1002bb | R28 | w28 | y28 |
| 1002bc | R29 | w29 | y29 |
| 1002bd | R30 | w30 | y30 |

RUN THIS PROCESS ONCE A MONTH

1. CREATE A SET OF RAW MATERIAL OF SAME PART GROUP / CUT TYPE BY THEIR WEIGHTS AND YIELDS AS IT IS SHOWN BESIDE.

2. INDICATE THE NUMBER OF CLASSES 'K' WE WANT TO GENERATE. 9 IN OUR CASE.

3. RANDOMLY SELECT K NUMBER OF CENTROIDS (W,Y).

4. FIND THE EUCLIDEAN DISTANCE OF EACH RM (wi,yi) FROM THE CENTROIDS (W,Y) SELECTED ABOVE.

5. ASSIGN EACH RAW MATERIAL TO ITS CLOSEST CENTROID i.e., MIN(EUCLIDEAN DISTANCE).

6. CALCULATE NEW MEAN (CENTROID) FOR EACH CLUSTER.

7. IF THE (OLD MEAN-NEW MEAN< TOLERANCE) THEN STOP ELSE REPEAT FROM STEP 4 WITH NEW MEAN.

8. THE MIN/MAX RANGES OF THE RAW MATERIALS IN THE CLUSTERS FROM THE BASIS OF WEIGHT CLUSTERING AND CLASSIFICATION. WE MAKE IT CONTINUOUS USING APPROXIMATION.

9. ANY NEW BOM ADDED USES THE OUTPUT AND SELECTS ITS CLUSTER.

| | CUTTING GROUP | SIZE | MIN WEIGHT 1208 | MAX WEIGHT 1210 | MIN YIELD 1212 | MAX YIELD 1214 |
|---|---|---|---|---|---|---|
| 1202a | DICE | SMALL_DICE1 | 0 | 1.67 | 0 | 33 |
| 1202b | DICE | SMALL_DICE2 | 0 | 1.67 | 33 | 66 |
| 1202c | DICE | SMALL_DICE3 | 0 | 1.67 | 66 | 100 |
| 1202d | DICE | MEDIUM_DICE1 | 1.68 | 2.09 | 0 | 33 |
| 1202e | DICE | MEDIUM_DICE2 | 1.68 | 2.09 | 33 | 66 |
| 1202f | DICE | MEDIUM_DICE3 | 1.68 | 2.09 | 66 | 100 |
| 1202g | DICE | LARGE_DICE1 | 2.1 | | 0 | 33 |
| 1202h | DICE | LARGE_DICE2 | 2.1 | | 33 | 66 |
| 1202i | DICE | LARGE_DICE3 | 2.1 | | 66 | 100 |

FIG. 12

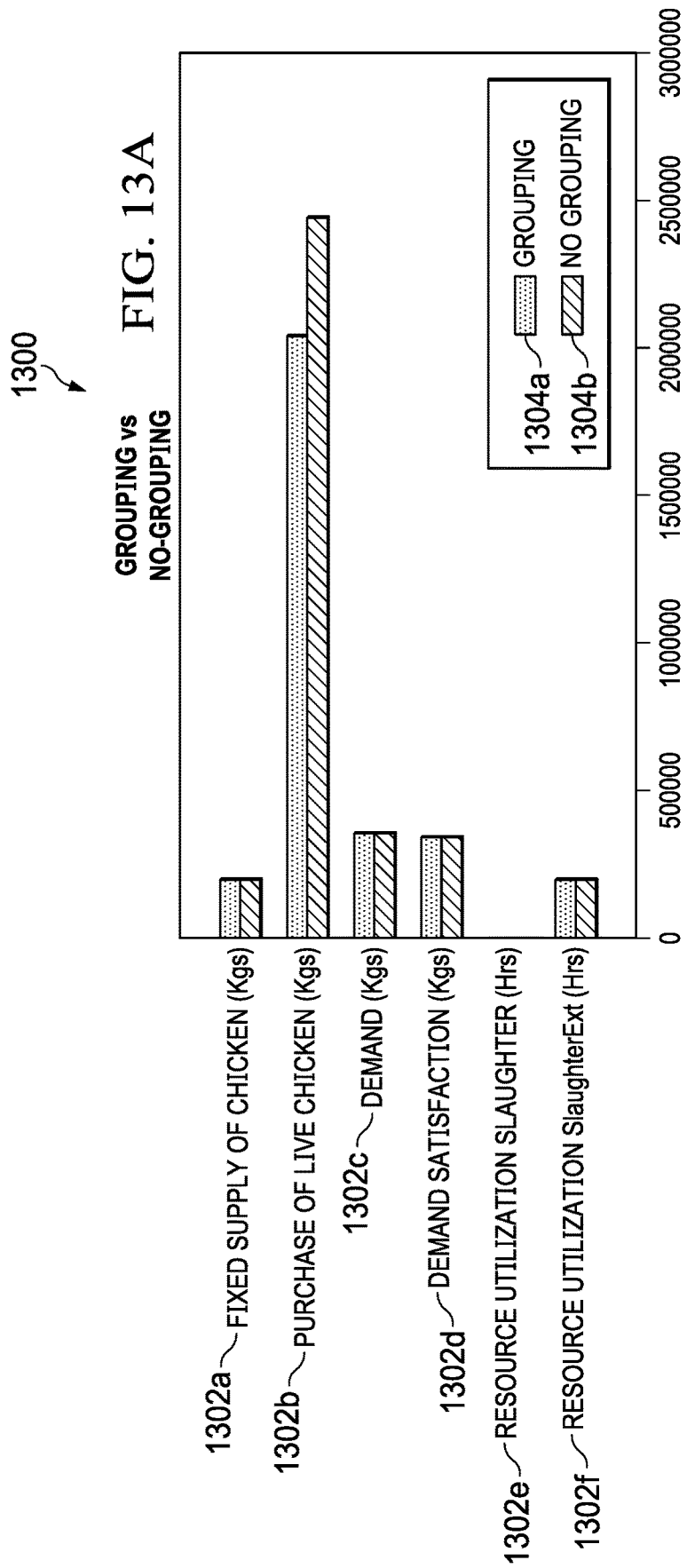

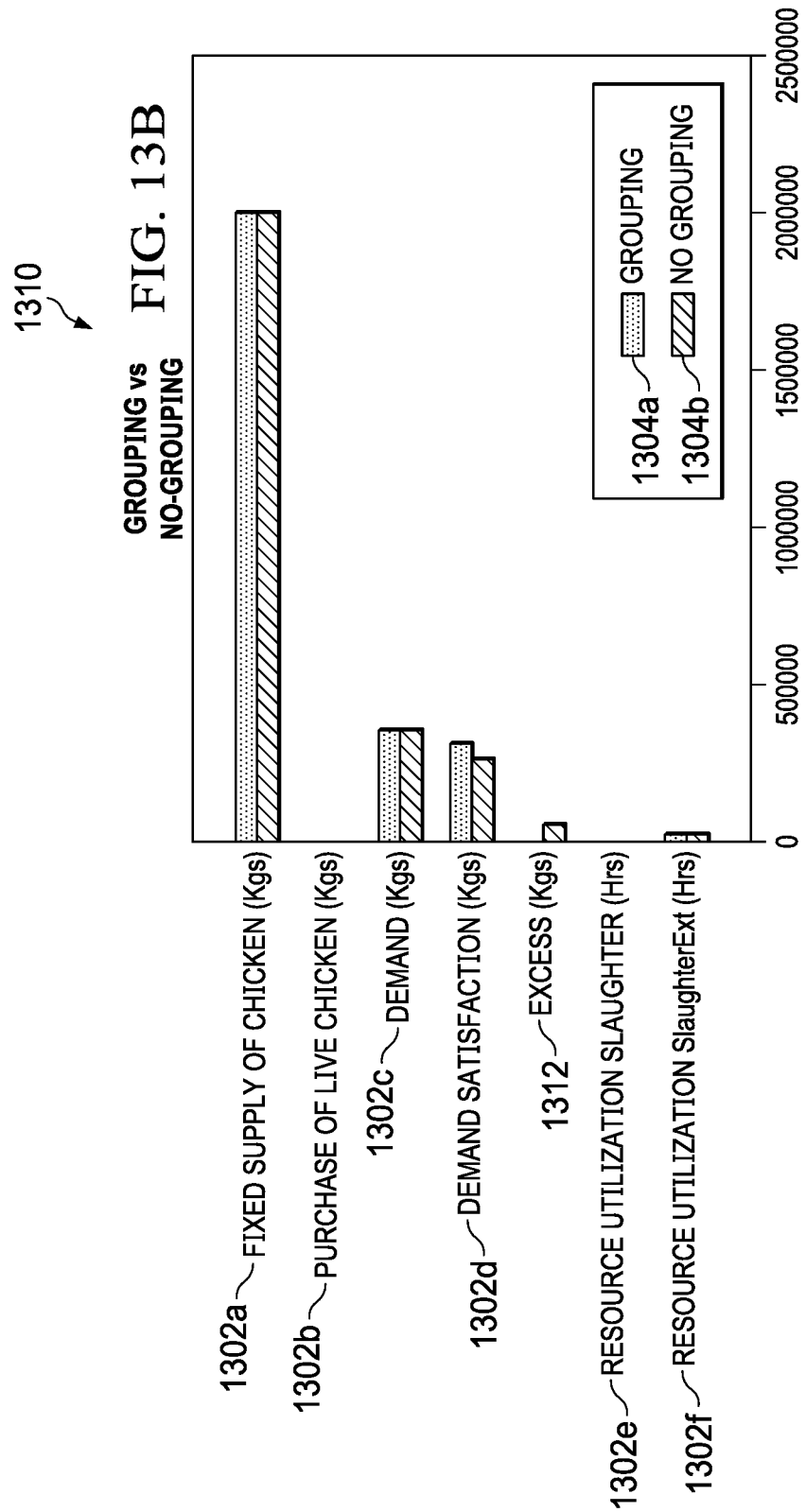

SYSTEM AND METHOD OF DISCRETE PLANNING FOR PROCESS INDUSTRY

CROSS-REFERENCE TO RELATED APPLICATIONS

The present disclosure is related to that disclosed in the U.S. Provisional Application No. 63/030,654, filed May 27, 2020, entitled "System and Method of Discrete Planning for Process Industry." U.S. Provisional Application No. 63/030,654 is assigned to the assignee of the present application. The subject matter disclosed in U.S. Provisional Application No. 63/030,654 is hereby incorporated by reference into the present disclosure as if fully set forth herein. The present invention hereby claims priority under 35 U.S.C. § 119(e) to U.S. Provisional Application No. 63/030,654.

TECHNICAL FIELD

The present disclosure relates generally to supply chain planning and specifically to discrete planning for products of process industries.

BACKGROUND

Linear programming (LP) optimization is an efficient technique for modeling and solving complex business goals in the presence of global constraints. However, process industries, such as, for example, meat processing, lack discretized planning, which prevents substitution and optimization of a supply chain plan. These drawbacks are undesirable.

BRIEF DESCRIPTION OF THE DRAWINGS

A more complete understanding of the present invention may be derived by referring to the detailed description when considered in connection with the following illustrative figures. In the figures, like reference numbers refer to like elements or acts throughout the figures.

FIG. 6 illustrates a chart of BOM grouping using weight classification, according to an embodiment;

FIG. 9 illustrates chart for calculating missing values, according to an embodiment;

FIG. 10 illustrates a raw material weight-yield table, according to an embodiment;

FIG. 12 illustrates a chart of the discretized products generated from weight-yield mapping of clusters using the BOM grouping method of FIG. 4, according to an embodiment; and FIGS. 13A-13B illustrate Key Performance Indicators (KPIs) for two example scenarios, according to an embodiment.

DETAILED DESCRIPTION

Figure 1:
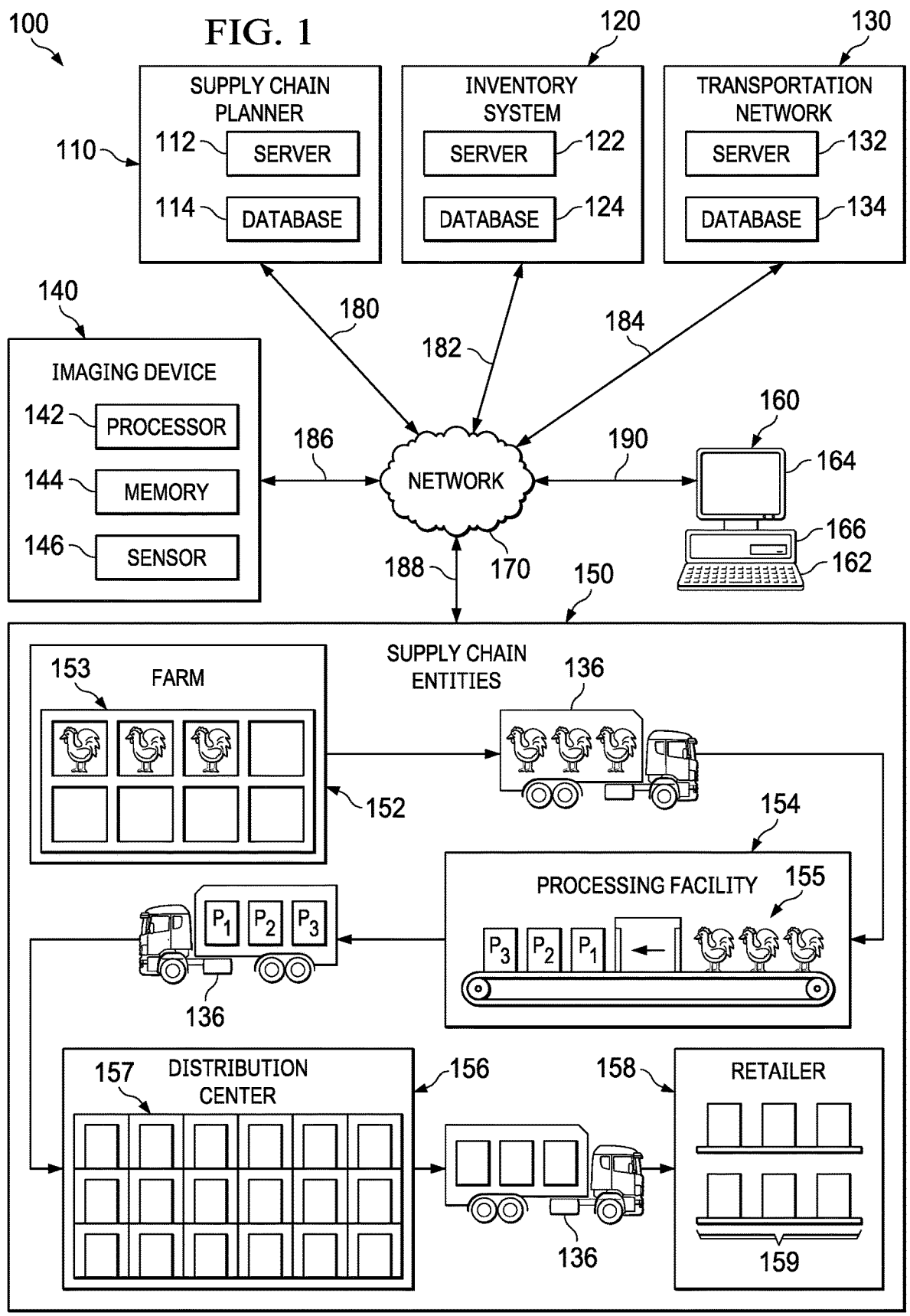
FIG. 1 illustrates the supply chain network, in accordance with a first embodiment.

Aspects and applications of the invention presented herein are described below in the drawings and detailed description of the invention. Unless specifically noted, it is intended that the words and phrases in the specification and the claims be given their plain, ordinary, and accustomed meaning to those of ordinary skill in the applicable arts.

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

FIG. 1 illustrates supply chain network 100, in accordance with a first embodiment. Supply chain network 100 comprises supply chain planner 110, inventory system 120, transportation network 130, one or more imaging devices 140, one or more supply chain entities 150, computer 160, network 170, and one or more communication links 180-190. Although a single supply chain planner 110, a single inventory system 120, a single transportation network 130, one or more imaging devices 140, one or more supply chain entities 150, a single computer 160, a single network 170, and one or more communication links 180-190 are shown and described, embodiments contemplate any number of supply chain planners, inventory systems, transportation networks, imaging devices, supply chain entities, computers, networks, and communication links, according to particular needs.

In one embodiment, supply chain planner 110 comprises server 112 and database 114. Server 112 comprises one or more modules to model, generate, and solve a supply chain planning problem modeled, at least in part, by Bill of Materials (BOM) grouping from reverse BOMs generated to discretize products of a process industry. By discretizing the production of processed goods, such as those obtained from batch or continuous processing, supply chain planner 110 calculates an optimal plan using dynamically assigned BOM groupings to satisfy demand for one product with the byproducts or coproducts of another product. In addition, or as an alternative, supply chain planner 110 uses dynamic BOM groupings to optimize business objectives, such as, for example, minimizing on-hand inventory, maximizing demand satisfaction, and other like objectives, as described in further detail below. According to an embodiment, supply chain planner 110 models the supply chain planning problem as an optimization problem, such as, for example, a multi-objective hierarchical linear programming (LP) problem and solves this LP problem for each objective in a hierarchy of objectives. Supply chain planner 110 may then generate a supply chain plan based, at least in part, on the calculated LP problem solution.

Inventory system 120 comprises server 122 and database 124. Server 122 of inventory system 120 is configured to receive and transmit inventory data, which may include, for example, item identifiers, pricing data, attribute data, inventory levels, and other like data about materials, items, products, and the like, at one or more locations in supply chain network 100. Server 122 of inventory system 120 stores inventory data to (and retrieves inventory data from) database 124 of inventory system 120 or from one or more locations in supply chain network 100.

Transportation network 130 comprises server 132 and database 134. According to embodiments, transportation network 130 directs one or more transportation vehicles 136 to ship one or more items between one or more supply chain entities 150, based, at least in part, on a supply chain plan, including a supply chain master plan, the quantity of items currently in stock at one or more supply chain entities 150 or other stocking location, the quantity of items currently in transit in transportation network 130, a forecasted demand, a supply chain disruption, and/or one or more other factors described herein. One or more transportation vehicles 136 comprise, for example, any number of trucks, cars, vans, boats, airplanes, unmanned aerial vehicles (UAVs), cranes, robotic machinery, or the like. One or more transportation vehicles 136 may comprise radio, satellite, or other communication that communicates location information (such as, for example, geographic coordinates, distance from a location, global positioning satellite (GPS) information, or the like) with supply chain planner 110, inventory system 120, transportation network 130, one or more imaging devices 140, and/or one or more supply chain entities 150 to identify the location of one or more transportation vehicles 136 and the location of any inventory or shipment located on one or more transportation vehicles 136.

One or more imaging devices 140 comprise one or more processors 142, memory 144, and one or more sensors 146, and may include any suitable input device, output device, fixed or removable computer-readable storage media, or the like. According to embodiments, one or more imaging devices 140 comprise an electronic device that receives imaging data from one or more sensors 146 or from one or more data storage locations in supply chain network 100. One or more sensors 146 of one or more imaging devices 140 may comprise an imaging sensor, such as, a camera, scanner, electronic eye, photodiode, charged coupled device (CCD), or any other electronic component that detects visual characteristics (such as color, shape, size, fill level, or the like) of objects. One or more imaging devices 140 may comprise, for example, a mobile handheld electronic device such as, for example, a smartphone, a tablet computer, a wireless communication device, and/or one or more networked electronic devices configured to image items using one or more sensors 146 and transmit product images to one or more databases. One or more sensors 146 may be located at one or more locations local to, or remote from, one or more imaging devices 140, including, for example, one or more sensors 146 integrated into one or more imaging devices 140 or one or more sensors 146 remotely located from, but communicatively coupled with, one or more imaging devices 140. According to some embodiments, one or more sensors 146 may be configured to communicate directly or indirectly with one or more of supply chain planner 110, inventory system 120, transportation network 130, one or more imaging devices 140, one or more supply chain entities 150, computer 160, and/or network 170 using one or more communication links 180-190.

In addition, or as an alternative, the one or more sensors may comprise a radio receiver and/or transmitter configured to read an electronic tag, such as, for example, a radio-frequency identification (RFID) tag. Each item may be represented in supply chain network 100 by an identifier, including, for example, Stock-Keeping Unit (SKU), Universal Product Code (UPC), serial number, barcode, tag, RFID, or the like. One or more imaging devices 140 may generate a mapping of one or more items in supply chain network 100 by scanning an identifier or object associated with an item and identifying the item based, at least in part, on the scan. This may include, for example, a stationary scanner located at one or more supply chain entities 150 that scans items as the items pass near the scanner. As explained in more detail below, supply chain planner 110, inventory system 120, transportation network 130, and one or more imaging devices 140 may use the mapping of an item to locate the item in supply chain network 100. The location of the item is then used to coordinate the storage and transportation of items in supply chain network 100 according to one or more plans generated by supply chain planner 110 and/or a reallocation of materials or capacity determined by solver 204 of supply chain planner 110. Plans may comprise one or more of a master supply chain plan, production plan, demand plan, distribution plan, and the like.

As shown in FIG. 1, supply chain network 100 comprising supply chain planner 110, inventory system 120, transportation network 130, one or more imaging devices 140, and one or more supply chain entities 150 may operate on one or more computers 160 that are integral to or separate from the hardware and/or software that support supply chain planner 110, inventory system 120, transportation network 130, one or more imaging devices 140, and one or more supply chain entities 150. Computers 160 may include any suitable input device 162, such as a keypad, mouse, touch screen, microphone, or other device to input information. Output device 164 may convey information associated with the operation of supply chain network 100, including digital or analog data, visual information, or audio information.

Computer 160 may include fixed or removable computer-readable storage media, including a non-transitory computer readable medium, magnetic computer disks, flash drives, CD-ROM, in-memory device or other suitable media to receive output from and provide input to supply chain network 100. Computer 160 may include one or more processors 166 and associated memory to execute instructions and manipulate information according to the operation of supply chain network 100 and any of the methods described herein. In addition, or as an alternative, embodiments contemplate executing the instructions on computer 160 that cause computer 160 to perform functions of the method. An apparatus implementing special purpose logic circuitry, for example, one or more field programmable gate arrays (FPGA) or application-specific integrated circuits (ASIC), may perform functions of the methods described herein. Further examples may also include articles of manufacture including tangible non-transitory computer-readable media that have computer-readable instructions encoded thereon, and the instructions may comprise instructions to perform functions of the methods described herein.

Supply chain planner 110, inventory system 120, transportation network 130, one or more imaging devices 140, and one or more supply chain entities 150 may each operate on one or more separate computers, a network of one or more separate or collective computers, or may operate on one or more shared computers. In addition, supply chain network 100 may comprise a cloud-based computing system having processing and storage devices at one or more locations, local to, or remote from supply chain planner 110, inventory system 120, transportation network 130, one or more imaging devices 140, and one or more supply chain entities 150. In addition, each of the one or more computers may be a workstation, personal computer (PC), network computer, notebook computer, tablet, personal digital assistant (PDA), cell phone, telephone, smartphone, mobile device, wireless data port, augmented or virtual reality headset, or any other suitable computing device. In an embodiment, one or more users may be associated with supply chain planner 110, inventory system 120, transportation network 130, one or more imaging devices 140, and one or more supply chain entities 150.

These one or more users may include, for example, a "manager" or a "planner" handling supply chain planning and/or one or more related tasks within supply chain network 100. In addition, or as an alternative, these one or more users within supply chain network 100 may include, for example, one or more computers programmed to autonomously handle, among other things, production planning, demand planning, option planning, sales and operations planning, supply chain master planning, inventory optimization, plan adjustment after supply chain disruptions, order placement, automated warehouse operations (including removing items from and placing items in inventory), robotic production machinery (including producing items), and/or one or more related tasks within supply chain network 100.

One or more supply chain entities 150 may represent one or more farms 152, processing facilities 154, distribution centers 156, and retailers 158 in one or more supply chain networks 100, including one or more enterprises. One or more farms 152 may be any suitable entity that produces farmed products 153. Although one or more farms 152 are described herein as one or more poultry farms that provide chickens to processing facility 154, embodiments contemplate farms producing any suitable farmed product, including, but not limited to, crops, plants, livestock, poultry, fish, and the like. In addition, one or more farms 152 may provide the farmed product to processing facility 154, another farm 152, or any other one or more entities in supply chain network 100, according to particular needs.

Processing facility 154 may be any suitable entity that produces one or more products by processing production methods. In one embodiment, processing facility 154 processes one or more farmed products 153 into one or more processed goods. In one embodiment, a processed good represents a product ready to be supplied to, for example, another supply chain entity, a product that needs further processing, or any other product. Processing facility 154 may, for example, produce and sell a processed good to another processing facility 154 (such as, for example, waste products that are processed into animal feed), farm 152 (such as, for example, animal feed), distribution center 156, retailer 158, a customer, or any other suitable entity. Such processing facilities may comprise automated robotic production machinery 155 that produce processed goods based, at least in part, on a supply chain plan, the quantity of items or products currently in stock at one or more supply chain entities 150, the quantity of items or products currently in transit in transportation network 130, a forecasted demand, a supply chain disruption, a material or capacity reallocation, current and projected inventory levels at one or more stocking locations, and/or one or more additional factors described herein.

One or more distribution centers 156 may be any suitable entity that offers to sell or otherwise distributes at least one product to one or more retailers 158 and/or customers. Distribution centers 156 may, for example, receive a product from a first supply chain entity 150 in supply chain network 100 and store and transport the product for a second supply chain entity 150. Such distribution centers 156 may comprise for example, one or more cold storage facilities 157 storing processed meat products. One or more retailers 158 may be any suitable entity that obtains one or more products to sell to one or more customers. One or more retailers may comprise any online or brick and mortar location.

Although one or more farms 152, processing facilities 154, distribution centers 156, and retailers 158 are shown and described as separate and distinct entities, the same entity may simultaneously act as any one or more farms 152, processing facilities 154, distribution centers 156, and retailers 158. Although one example of supply chain network 100 is shown and described, embodiments contemplate any configuration of supply chain network 100, without departing from the scope of the present disclosure.

In one embodiment, supply chain planner 110 may be coupled with network 170 using communication link 180, which may be any wireline, wireless, or other link suitable to support data communications between supply chain planner 110 and network 170 during operation of supply chain network 100. Inventory system 120 may be coupled with network 170 using communication link 182, which may be any wireline, wireless, or other link suitable to support data communications between inventory system 120 and network 170 during operation of supply chain network 100. Transportation network 130 may be coupled with network 170 using communication link 184, which may be any wireline, wireless, or other link suitable to support data communications between transportation network 130 and network 170 during operation of supply chain network 100. One or more imaging devices 140 are coupled with network 170 using communication link 186, which may be any wireline, wireless, or other link suitable to support data communications between one or more imaging devices 140 and network 170 during operation of distributed supply chain network 100. One or more supply chain entities 150 may be coupled with network 170 using communication link 188, which may be any wireline, wireless, or other link suitable to support data communications between one or more supply chain entities 150 and network 170 during operation of supply chain network 100. Computer 160 may be coupled with network 170 using communication link 190, which may be any wireline, wireless, or other link suitable to support data communications between computer 160 and network 170 during operation of supply chain network 100. Although communication links 180-190 are shown as generally coupling supply chain planner 110, inventory system 120, transportation network 130, one or more imaging devices 140, one or more supply chain entities 150, and computer 160 to network 170, each of supply chain planner 110, inventory system 120, transportation network 130, one or more imaging devices 140, one or more supply chain entities 150, and computer 160 may communicate directly with each other, according to particular needs.

In another embodiment, network 170 includes the Internet and any appropriate local area networks (LANs), metropolitan area networks (MANs), or wide area networks (WANs) coupling supply chain planner 110, inventory system 120, transportation network 130, one or more imaging devices 140, one or more supply chain entities 150, and computer 160. For example, data may be maintained local to, or externally of, supply chain planner 110, inventory system 120, transportation network 130, one or more imaging devices 140, one or more supply chain entities 150, and computer 160 and made available to one or more associated users of supply chain planner 110, inventory system 120, transportation network 130, one or more imaging devices 140, one or more supply chain entities 150, and computer 160 using network 170 or in any other appropriate manner. For example, data may be maintained in a cloud database at one or more locations external to supply chain planner 110, inventory system 120, transportation network 130, one or more imaging devices 140, one or more supply chain entities 150, and computer 160 and made available to one or more associated users of supply chain planner 110, inventory system 120, transportation network 130, one or more imaging devices 140, one or more supply chain entities 150, and computer 160 using the cloud or in any other appropriate manner. Those skilled in the art will recognize that the complete structure and operation of network 170 and other components within supply chain network 100 are not depicted or described. Embodiments may be employed in conjunction with known communications networks and other components.

In accordance with the principles of embodiments described herein, supply chain planner 110 may generate a supply chain plan using one or more optimization methods. Furthermore, one or more computers 160 associated with supply chain network 100 may instruct automated machinery (i.e., robotic warehouse systems, robotic inventory systems, automated guided vehicles, mobile racking units, automated robotic production machinery, robotic devices and the like) to adjust product mix ratios, inventory levels at various stocking points, processing equipment of processing facilities, proportional or alternative sourcing of one or more supply chain entities 150, and the configuration and quantity of packaging and shipping of products based, at least in part, on a supply chain plan, the quantity of items or products currently in stock at one or more supply chain entities 150, the quantity of items or products currently in transit in transportation network 130, a forecasted demand, a supply chain disruption, a material or capacity reallocation, current and projected inventory levels at one or more stocking locations, and/or one or more additional factors described herein. For example, the methods described herein may include one or more computers 160 receiving product data 212 (see FIG. 2) from automated machinery having at least one sensor and product data 212 corresponding to an item detected by the automated machinery. Received product data 212 may include an image of the item, an identifier, as described above, and/or product information associated with the item, including, for example, dimensions, cut type, texture, estimated weight, and the like. One or more computers 160 may also receive, from one or more sensors 146 of one or more imaging devices 140, a current location or condition of the identified item.

The methods may further include one or more computers 160 looking up received product data 212 in the database system associated with supply chain planner 110 to identify the item corresponding to product data 212 received from automated machinery. Based on the identification of the item, one or more computers 160 may also identify (or alternatively generate) a first mapping in the database system, where the first mapping is associated with the current location of the identified item. One or more computers 160 may also identify a second mapping in the database system, where the second mapping is associated with a past location of the identified item. One or more computers 160 may also compare the first mapping and the second mapping to determine if the current location of the identified item in the first mapping is different than the past location of the identified item in the second mapping. One or more computers 160 may then send instructions to the automated machinery based, as least in part, on one or more differences between the first mapping and the second mapping such as, for example, to locate items to add to or remove from an inventory of or shipment for one or more supply chain entities 150. In addition, or as an alternative, supply chain planner 110 monitors one or more supply chain constraints of one or more items at one or more supply chain entities 150 and adjusts the orders and/or inventory of one or more supply chain entities 150 at least partially based on one or more supply chain constraints.

Figure 2:
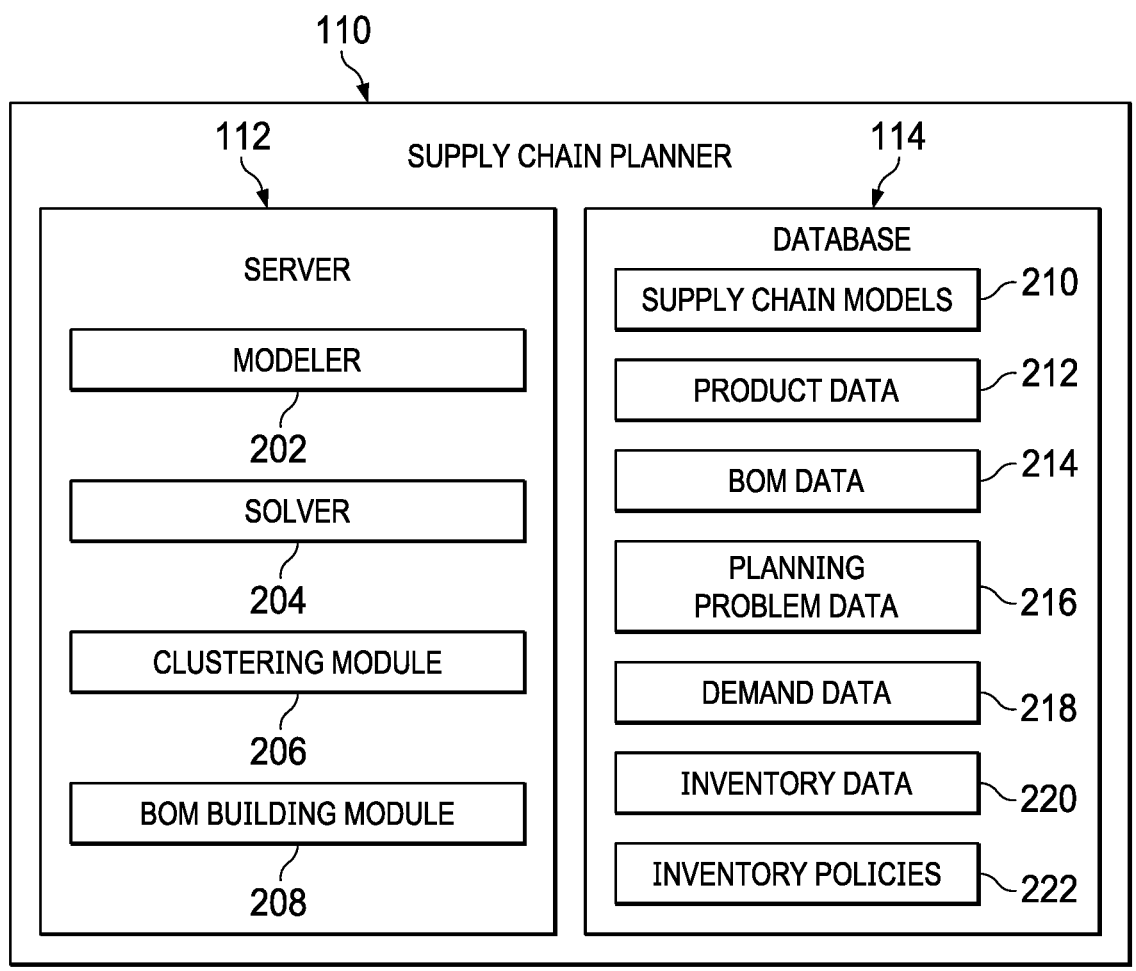
FIG. 2 illustrates the supply chain planner of FIG. 1 in greater detail, according to an embodiment.

FIG. 2 illustrates supply chain planner 110 of FIG. 1 in greater detail, according to an embodiment. As discussed above, supply chain planner 110 may comprise server 112 and database 114. Although supply chain planner 110 is shown as comprising a single server 112 and a single database 114, embodiments contemplate any suitable number of servers or databases internal to, or externally coupled with, supply chain planner 110.

Server 112 of supply chain planner 110 comprises modeler 202, solver 204, clustering module 206, and BOM building module 208. Although server 112 is shown and described as comprising a single modeler 202, a single solver 204, a single clustering module 206, and a single BOM building module 208, embodiments contemplate any suitable number or combination of these located at one or more locations local to, or remote from, supply chain planner 110, such as on multiple servers or computers at any location in supply chain network 100.

As described in further detail below, modeler 202 models production of processed goods as one or more supply chain planning problems, such a, for example, an LP optimization problem. According to embodiments, modeler 202 generates one or more supply chain data models that represent the supply chain components (such as, for example, materials (items, products, finished goods, raw materials, and the like), resources, operations, buffers, pathways, constraints, demand, and the like) of supply chain network 100. By way of example only and not by way of limitation, modeler 202 generates a hierarchical multi-objective LP problem that represents the supply chain planning problem based, at least in part, on the dynamically assigned BOM groupings.

According to embodiments, solver 204 of supply chain planner 110 solves the planning problem by solving one or more objectives, including, for example, a series of hierarchically prioritized objectives. Solver 204 comprises one or more optimization solvers and/or one or more heuristic solvers that generate a solution to a supply chain planning problem, which may be used to calculate a supply chain plan which may comprise, for example, a production plan, as disclosed above.

Clustering module 206 of supply chain planner 110 uses one or more clustering techniques, such as, for example, K-means clustering, to generate weight-yield clusters of raw materials sharing the same material dimension (part type) and processing dimension (cut type). Clustering module 206 generates discretized product groupings, that are used by BOM building module 208 to dynamically assign raw materials to BOM groupings. Clustering module 206 updates the clusters at, for example, particular times, periodic intervals, in response changes in supply chain network 100, or other like update criteria.

BOM building module 208 creates reverse BOMs and dynamically assigns BOM groupings based, at least in part, on the weight-yield clusters generated by clustering module 206. As described in further detail below, BOM building module 208 creates dynamically-assigned BOM groupings to optimize demand among coproducts and byproducts by creating discrete BOMs for process industry products. The substitution happens among the clusters created for the final demand depending on the customer's specification. For example, while some customers are specific about the attributes of the product, others are flexible. Product attributes are described in further detail below.

Database 114 of supply chain planner 110 may comprise one or more databases or other data storage arrangement at one or more locations, local to, or remote from, server 112. Database 114 comprises, for example, supply chain models 210, product data 212, BOM data 214, planning problem data 216, demand models 218, inventory data 220, and inventory policies 222. Although, database 114 is shown and described as comprising supply chain models 210, product data 212, BOM data 214, planning problem data 216, demand models 218, inventory data 220, and inventory policies 222, embodiments contemplate any suitable number or combination of these, located at one or more locations, local to, or remote from, supply chain planner 110 according to particular needs.

Supply chain models 210 represent the flow of materials through one or more supply chain entities 150 of supply chain network 100. Modeler 202 may model the processing of materials through processing facility 155 or any number of one or more supply chain entities 150 using any suitable supply chain models 210, such as, for example, network model 700 (FIG. 7) and network model 800 (FIG. 8) representing materials, resources, operations, and the like using nodes and edges, as described in more detail below. According to an embodiment comprising a poultry processor, described in further detail below, the supply chain comprises a batch or continuous production process comprising at least three levels, wherein the poultry (such as, for example, chicken) is slaughtered into many parts, some of which are cut into particular sizes and shapes. Some of the sized and shaped parts, are then further processed using, for example, one or more cooking techniques. As described in further detail below, supply chain planner 110 generates supply chain models 210 using reverse BOMs and updates the model in response to receiving updated BOM groupings.

Product data 212 of the database may comprise one or more data structures for identifying, classifying, and storing data associated with products, including, for example, a product identifier (such as a Stock Keeping Unit (SKU), Universal Product Code (UPC), or the like), product attributes and attribute values, sourcing information, and the like. Product data 212 may comprise data about one or more products organized and sortable by, for example, product attributes, attribute values, product identification, sales quantity, demand forecast, or any stored category or dimension. Attributes of one or more products may be, for example, any categorical characteristic or quality of a product, and an attribute value may be a specific value or identity for the one or more products according to the categorical characteristic or quality, including, for example, physical parameters (such as, for example, size, weight, mass, direction and number of cuts, dimensions (length, width, height, etc.), fill level, color, and the like), qualitative parameters (such as, for example, standards, grades, or the like, used to classify crops, foods, poultry, livestock, etc.), and relative parameters (such as, for example, the yield percentage of a particular product relative to another product). BOM data 214 comprises reverse BOMs and BOM groupings generated for one or more products of a process industry, as described in further detail below.

Planning problem data 216 comprises formulations and related data of supply chain planning problems. Planning problem data 216 may comprise for example, various decision variables, business constraints, goals, and objectives of one or more supply chain entities 150. According to some embodiments, planning problem data 216 may comprise hierarchical objectives specified by, for example, business rules, master planning requirements, scheduling constraints, and discrete constraints, including, for example, sequence dependent setup times, lot-sizing, storage, shelf life, and the like.

Demand data 218 of the database comprises, for example, historical and forecasted demand, as well as historical and forecasted sales, purchase data, promotions, events, or the like of one or more supply chain entities 150. Demand data 218 may cover a time interval such as, for example, by the minute, hour, daily, weekly, monthly, quarterly, yearly, or any suitable time interval, including substantially in real time. According to embodiments, demand data 218 may include historical demand and sales data or projected demand forecasts for one or more retail locations, customers, regions, or the like of one or more supply chain entities 150 and may be segmented according to one or more of product attributes, customers, regions, and the like.

Inventory data 220 of the database may comprise any data relating to current or projected inventory quantities or states, order rules, and the like. For example, inventory data 220 may comprise the current level of inventory for each product at one or more stocking locations across supply chain network 100. In addition, inventory data 220 may comprise order rules that describe one or more rules or limits on setting an inventory policy, which may include, but are not limited to, a minimum order quantity, a maximum order quantity, a discount, a step-size order quantity, and batch quantity rules. According to some embodiments, supply chain planner 110 accesses and stores inventory data 220 in the database, which may be used by supply chain planner 110 to place orders, set inventory levels at one or more stocking points, initiate production of one or more products, and the like. In addition, or as an alternative, inventory data 220 may be updated by receiving one or more of current quantities, mappings, and locations from inventory system 120, transportation network 130, one or more imaging devices 140, and/or one or more supply chain entities 150.

Inventory policies 222 of the database may comprise any suitable inventory policy describing the reorder point and target quantity, or other inventory policy parameters that set rules for supply chain planner 110 to manage and reorder inventory. Inventory policies 222 may be based on target service level, demand, cost, fill rate, or the like. According to embodiment, inventory policies 222 comprise target service levels that ensure that a service level of one or more supply chain entities 150 is met with a certain probability. For example, one or more supply chain entities 150 may set a target service level at 95%, meaning one or more supply chain entities 150 will set the desired inventory stock level at a level that meets demand 95% of the time.

Figure 3:
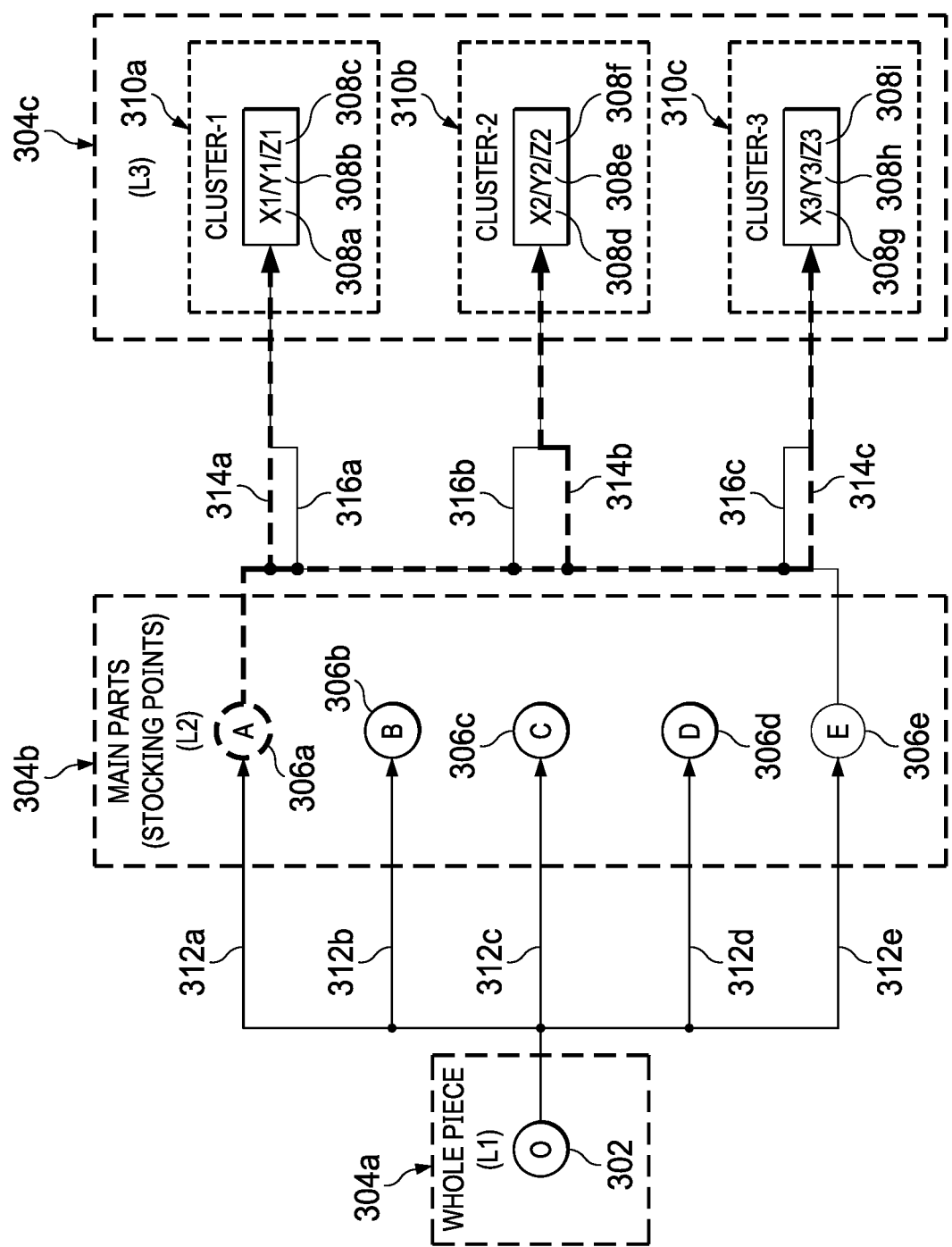
FIG. 3 illustrates product processing, according to an embodiment.

FIG. 3 illustrates product processing 300, according to an embodiment. In the illustrated example of product processing 300, a product is processed from a Whole Piece (O) 302 at a first level 304*a* into five main parts (A)-(E) 306*a*-306*e* at a second level 304*b*, and main parts 306*a*-306*e* are further processed into specialized, sellable co-products 308a-308i at third level 304c. Co-products 308a-308i are clustered into three clusters 310a-310c.

As described in further detail below, optimization planning is difficult for process industries, such as meat processing, based, at least in part, on the lack of discretized planning. For some process products, the varying size of the input (e.g. whole piece 302) combined with various yield quantities of production processes (represented by edges 312a-312e, 314a-314c, and 316a-316c) result in co-products with nearly infinite variation of dimension combinations. However, demand for a product, such as, for example, co-products 308a-308i, provides for little if any variation from required specifications. By way of further explanation and not by limitation, an example is given for a specially cut item, having a particular set of dimensions wherein the demand for the item comprises specific details about the type of the cut and the dimensions corresponding to the cut such as the length, breadth and the thickness. For meat processing, in particular, additional sources of complexity include: (1) independent demand may be received at any level for processed items; (2) demand for one product yields byproducts and/or coproducts leading to high levels of wasted inventory; (3) customer-specific requirements for the standard, grade, and size of the animals; and (4) customer-specific size, shape, and processing requirements. Owing to such a large variety of possible products, the complexity of modeling the substitution of coproducts and byproducts during planning leads to a lot of meat wastage.

Accordingly, supply chain planner 110 clusters co-products 308a-308i by determining a quantity of clusters 310a-310c and a basis for clustering to eliminate waste and more efficiently move process products throughout supply chain network 100. When clustering a process product represented by a reverse BOM, supply chain planner 110 may use BOM grouping method 400 (FIG. 4) based on different attributes such as the raw material part type, cutting type, yield, size, and the like, mapping of finished goods to one or more groups to enable substitution, and performing inventory sweep before making new product during planning.

Referring to the illustrated example of product processing 300, the demand for co-product X1 308a results in the consumption of part A 306a and yields co-product X2 308d and co-product X3 308g at the most downstream level (L3) 304c and co-products corresponding to parts B, C, D, E 306b-306e at one level higher (L2) 304b. Similarly, the demand for co-product Y1 308b and co-product Z1 308c may result in co-products Y2/Y3 308e and 308h and co-products Z2/Z3, 308f and 308i, respectively, as well as co-products by extra production of parts B/C/D/E 306b-306e. By way of a further example and not by way of limitation, product processing 300 may comprise producing co-products X1/X2/X3, Y1/Y2/Y3, and/or Z1/Z2/Z3 (308a-308i) from part E 306e as indicated by edges 316a-316c. Continuing this example, when a new demand (such as, for example, a hypothetical new product, Yn, having specifications close to, for example, current co-product Y2 308e) may be produced from part A 306a or part E 306e and), then processing of the product may comprise completely using the inventory of a current co-product (e.g., co-product Y2 308e) prior to making producing new supply of part A 306a or part E 306e.

Although clusters 310a-310c are described as comprising a particular quantity and selection of co-products 308a-308i based on disclosed attributes, embodiments contemplate clusters 310a-310c having any suitable quantity or selection of products based on any suitable attributes. In addition, other groupings are contemplated that comprise any suitable number or combination of raw materials, while particular embodiments may, in addition, define the attributes to limit data size to a manageable amount and fulfill any business requirements.

Figure 4:
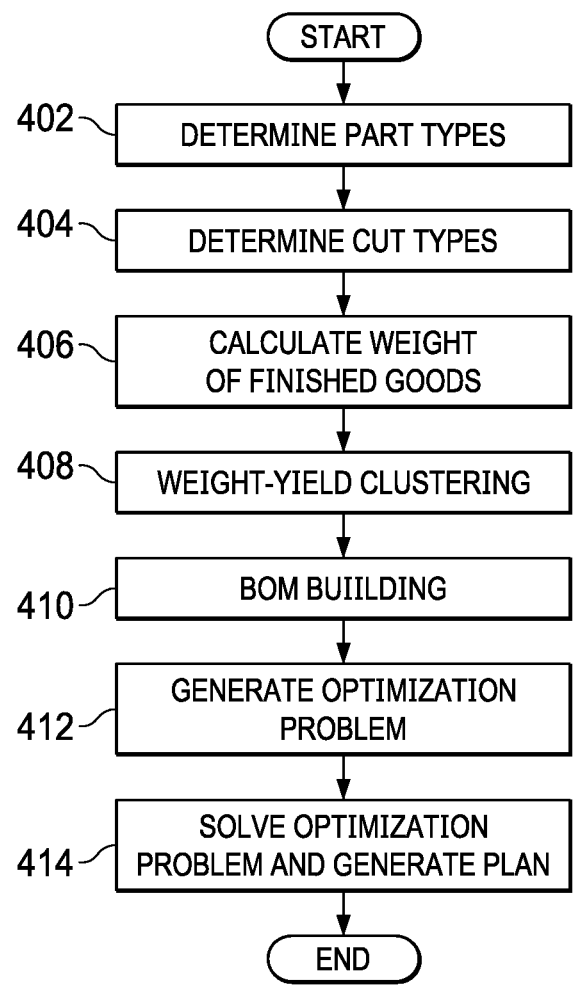
FIG. 4 illustrates the BOM grouping method, according to an embodiment.

FIG. 4 illustrates BOM grouping method 400, according to an embodiment. Although method 400 is illustrated as a particular sequence of activities, embodiments contemplate one or more activities being performed in one or more combinations, according to particular needs. As described in further detail below, method 400 includes generating discretized planning BOMs for a process industry followed by optimization of a supply chain planning problem to, for example, reduce waste of coproducts and byproducts produced by process industries.

At activity 402, clustering module 206 determines part types for two or more raw materials. By way of example only not by way of limitation, an example is given by referring to FIG. 3, wherein the whole piece is described as representing a whole chicken (or other animal), which is processed into one or more parts (A)-(E), such as, in this example, chicken parts, such as, for example, the BIL, wings, BB, SM, carcass, and the like. According to embodiments, part type of a finished good (FG) is determined by the attributes of the FG. Processing of chicken may comprise dividing the animal into parts having various levels of importance (high-level, initial level, main-level, or other suitable selection). The selected parts or level may be used as a logical grouping criterion for the FGs. In other meat or other product processing industries, main parts may be similarly identified and criteria used for grouping. Although the following examples are described in connection with chicken processing, embodiments contemplate processing other meat products, such as, for example, beef, sheep, pork, shrimp, fish, other types of poultry, and the like.

At activity 404, clustering module 206 determines cut types for two or more raw materials. Continuing with the example of chicken processing, an attribute of the raw materials may be cut type of the FG, e.g. block, sizing, dice, strip, and other like cut types. Because the number of shapes in which meat may be cut is limited (geometrically), cut type provides for a logical point of grouping. Although the example of chicken processing comprises clustering module 206 using the cut type as an attribute of logical grouping, embodiments contemplate product processing according to other suitable limited groupings of attributes.

At activity 406, clustering module 206 calculates weights of the finished goods produced from the raw materials. Often the weight and/or one or more dimension values (thickness, length, and width) are missing from product data 212. When only the weight is the missing value, clustering module 206 calculates the weight using the density and volume of the finished good. When one or more dimension values are missing, supply chain planner 110 uses a best fit curve to data mine the values of the missing dimensions using, for example, R code, to extrapolate from known dimension values to find the best fit, as described in connection with FIG. 9 in further detail below.

At activity 408, clustering module 206 generates clusters of finished goods using weight-yield clustering. According to embodiments, clustering module 206 performs weight-yield clustering, using a K-means clustering method, for groups of the finished goods whose raw materials share the same first dimension (part type) and the same second dimension (cut type) as described in further detail below in connection with FIGS. 10-11, below. According to embodiments, clustering is performed at intervals, such as, for example, at a recurring basis, such as, for example, monthly. Although clustering is described as being performed monthly using a K-means clustering method, embodiments contemplate clustering performed at any suitable interval such as, for example, daily, weekly, monthly, quarterly, yearly, or any other like period of time and using any suitable clustering method, according to particular needs.

At activity 410, BOM building module 208 creates discretized BOM groupings using the generated clusters. As described in further detail below in connection with FIG. 12, applying BOM grouping to raw materials results in reducing the quantity of live chickens needed to meet demand. The BOM groupings replace raw materials produced as coproducts or byproducts of other demands with new products that are assigned a minimum and/or maximum weight, minimum and/or maximum dimensions (thickness, width, and length), and/or specialized cuts (dice, strip, block etc.). BOM groupings are modeled into reverse BOMs to allow discrete planning of products of batch and continuous processing. According to some embodiments, BOM groupings reduce the quantity of produced coproducts, which reduces the amount of processed product that is wasted or placed in frozen storage, as well as reducing the overall amount of meat consumed.

At activity 412, modeler 202 of supply chain planner 110 models a supply chain planning problem using the BOM groupings. According to embodiments, modeler 202 models the supply chain planning problem as an LP optimization problem, having variables, constraints, and one or more objectives. In one embodiment, a Work-In-Progress (WIP) flush technique is set as at least one of the objectives, which generates a plan that reduces the amount of meat produced at each level by consuming all meat before slaughtering new live chickens. According to embodiments, WIP flush comprises using WIP that may be present in the system towards satisfying demand before the use of fresh production. When several alternates are available, WIP that is less preferred may be consumed by demands before mandating fresh production to satisfy demand. In addition, or as an alternative, modeler 202 models LP using one or more other objective, such as, for example, minimizing amount not satisfied, backlog, us of alternates, minimum or maximum safety stock violations; and/or maximizing profit or inventory optimization.

At activity 414, solver 204 of supply chain planner 110 solves the supply chain planning problem. According to embodiments, solver 204 uses LP and/or heuristic methods to solve an optimization supply chain planning problem and generate an optimized supply chain plan. Supply chain planner 110 may solve a supply chain planning problem using LP optimization by iteratively solving the minimization of each objective level in the hierarchy of objectives, fixing variables at their upper and lower bounds using the basis and reduced cost information of the solution for each objective level, updating the set of constraints until reaching the last objective level, and generating a global optimized solution, which is used by supply chain planner 110 generate a supply chain plan.

Figure 5A:
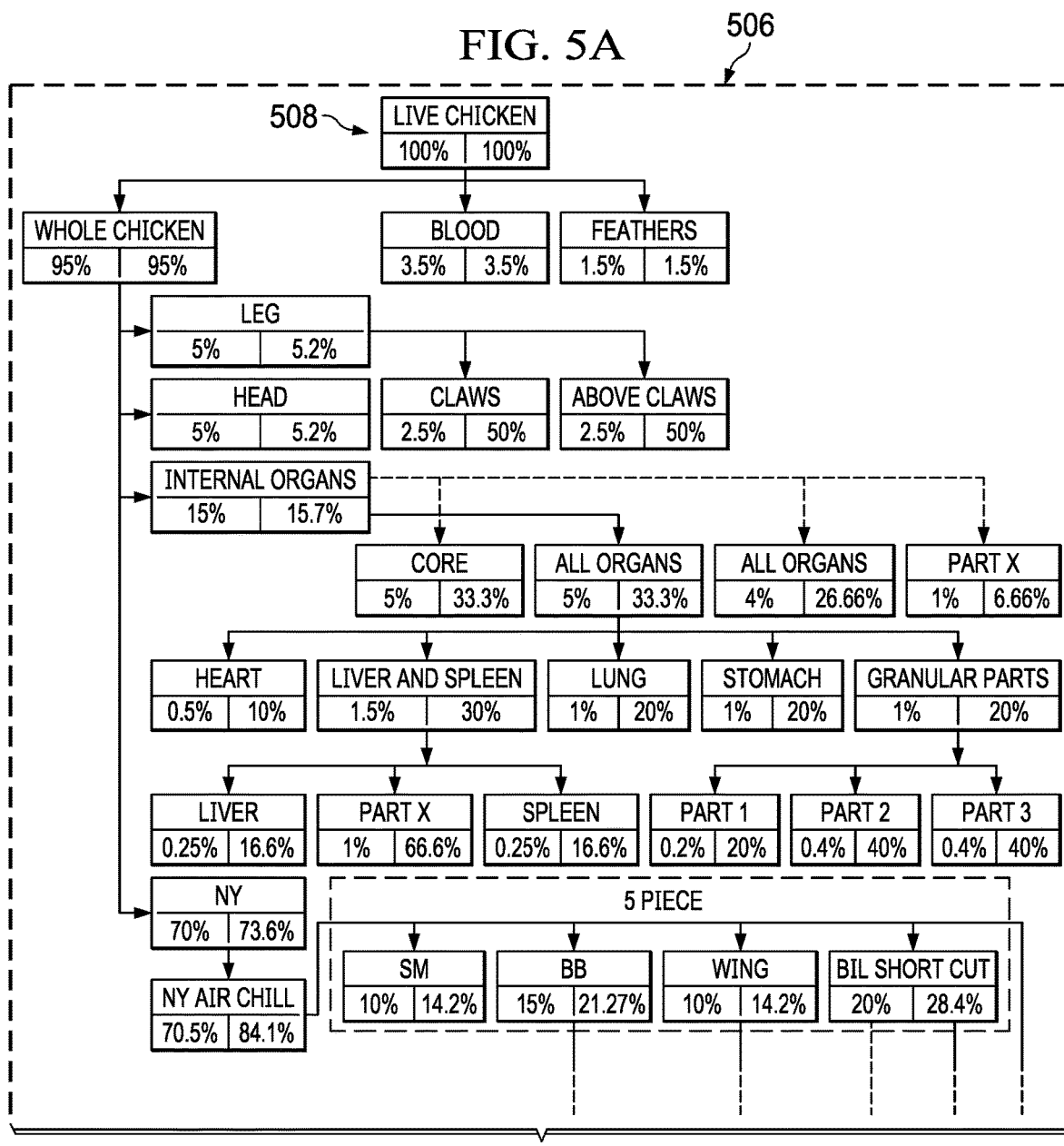
FIGS. 5A-5B illustrate independent demand received for processed items at three levels of a meat processor, according to an embodiment.
Figure 5B:
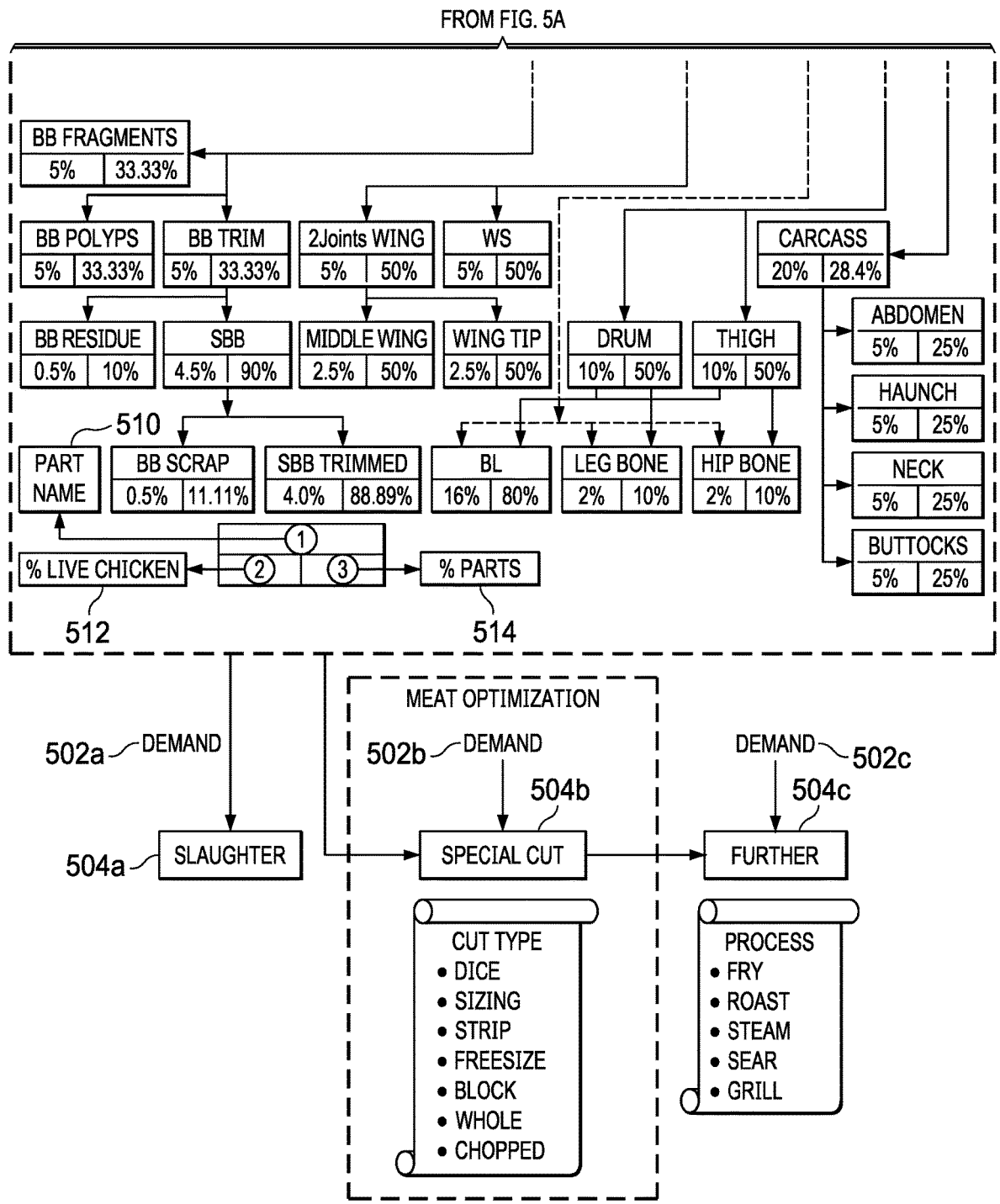

FIGS. 5A-5B illustrate independent demand 502a-502c received for processed items at three levels 504a-504b of a meat processor, according to an embodiment. In the illustrated embodiment, the meat processor receives independent demands 502a-502c at three levels: slaughter 504a; special cut 504b; and further 504c. Slaughter 504a receives demand 502a for parts represented by reverse BOM 506 that begins with live animal 508 and proceeds with various coproducts and byproducts produced during the slaughtering process. Special cut 504b receives demand 502b for meat produced from the slaughtering process which is cut a particular size and shape. Further 504c receives demand 502c for parts which are additionally, or further, processed by processes, such as, for example, various cooking methods, or other optional processes that may be applied to the product prior to sale.

By way of further explanation and not by way of limitation, the meat processor may comprise a poultry processor that receives live chickens and sells processed poultry items having different sizes, shapes, and cooking preparations. According to one embodiment, the three main steps of meat processing are slaughter, special cut and further. Slaughter yields the main parts of the animal. After slaughtering, the parts of the chicken may be processed at the special cut level, where the five pieces of the chicken are cut to particular shapes and sizes, such as for example, dice, size, strip, free size, block, whole, and chopped. The various types of special cuts are different combinations of cut size and cut dimensions. Continuing with this example, reverse BOM 506 of live animal 508 (in this example, a chicken) indicates, for each part: name 510; live animal percentage 512; and preceding part percentage 514. Processing of live animal 508 progresses downward through various slaughtering processes to the resulting parts of the fully slaughtered animal. For the example of the live chicken, the blood and feathers (having yields of 3.5% and 1.5%, respectively) are removed first, resulting in a whole chicken (yielding 95% of the live animal). This is followed by removal of the head, legs, and internal organs, resulting in the NY Cut, comprising approximately 70-70.5% of the live animal. The NY cut it is divided into five piece 516. Five piece 516 comprises the four main chicken products obtained from the processing of the NY Cut into the pelvic muscles (SM), the breast and attached breastbone (BB), the wing, the bone-in-leg (BIL), and the resulting carcass. Carcass is part of the 5-piece and is treated as waste for commercial and planning purposes and is therefore omitted from FIGS. 7 and 8, below. Processing the NY Cut into five piece 516 results in yields, as an approximate percentage of the NY Cut, of: SM (14.2%); BB (21.27%); Wing (14.2%), BIL (28.4%), and Carcass (26.4%). The yield for each of these cuts as an approximate percentage of the live chicken are: SM (10%); BB (15%); Wing (10%), BIL (20%), and Carcass (20%). The SM, the BB, the wing, and the BIL are the four main products, which may be further trimmed down, cut into several parts, skin removed, and the like to make special pieces represented by special cut 504b. In addition, every part of a processed animal, such as each part of the processed chicken represented by reverse BOM 506 may be subject to some level of demand. Because all poultry parts may comprise independent as well as dependent demand, the optimizing the quantity of chicken that is consumed provides for more accurately and precisely meeting the received demands.

Parts of reverse BOM 506 may also represent the stocking points in the manufacturing cycle. The main parts are in turn cut into specialized forms to enhance the culinary experience. This special cut meat may be sold not only as raw meat in a chilled or frozen state, but may also be processed further by marinating, roasting, grilling, or other similar optional processes. Continuing with the illustrated example, first two levels (i.e., slaughter 504a and special cut 504b) yield numerous co-products with varying dimensions depending on the size of the raw material and the cut type. Unlike process industries, in a discrete manufacturing industry, the attributes and dimensions of a co-product and/or a by-product are known beforehand, which provides for mapping of co-products to downstream processes and defining BOMs. Although process industries lack this capability, embodiments of the method, as described in further detail below, provide for clustering co-products and defining BOMs. In poultry processing for example, products are clustered at the special cut level 504*b* (e.g. dice, nuggets, slices, strips, blocks etc.). In pork processing, products are clustered as, for example, fillets, steaks, slices, and the like.

FIG. 6 illustrates chart 600 of BOM grouping using weight classification, according to an embodiment. Chart 600 comprises planning item 602 (which is the finished good for which demand exists), grouping item code 604 (codes to which more than one planning item may be mapped), groups 606 (assigned to various ranges of minimum weight 608, maximum weight 610, minimum yield 612, maximum yield 614, part type 616, and part group 618) which are used to generate the unique BOM clusters, represented in this embodiment by a unique cluster number 620 (Cluster-No).

Items during special cut are grouped into discrete grouping item codes 604. Grouping item codes 604 are created based on attributes of the items. Part type 616 and part group 618 are received as item attributes. Part type 616 is, in the illustrated example, the 5-piece part to which the item belongs (e.g., MG16, MG14, etc., which represents an SBB part type). Part group 618 is the type of cut (e.g., DICE, STRIP, etc.). Groups are further formed based on the weight-yield (groups 604, e.g., MEDIUM_DICE2, SMALL_STRIP2, etc.). The weight yield clusters (cluster number 620) are derived based on weights (e.g., minimum weight 608 and maximum weight 610) and yields (e.g., minimum yield 612 and maximum yield 614) of the item, as described in further detail below. The combination of part type 616, part group 618, and weight-yield clusters 620 result in the formation of the final grouping item codes 604.

Although particular examples of special cuts are described, embodiments contemplate any number of special cuts grouped according to any suitable parameter that distinguishes one type of special cut meat from another type, according to particular needs. The products created by special cut processing may be sold or subjected to further processing, prior to being sold. Further processes that may be performed on the special cut products include, for example, various cooking methods, such as, for example, fry, roast, steam, sear, and grill. Although particular types of further processing are described as types of cooking methods, embodiments contemplate using other types of meat processing, according to particular needs.

During poultry processing, the production of one product results in the production of many byproducts and coproducts. If the byproducts and coproducts are not needed to fulfill other demands (which often happens when satisfying large demands for products produced from only one chicken part), the byproducts and coproducts are wasted or placed in frozen storage. While wasting product is expensive, freezing also incurs high costs, not only from storage capacity and freezer costs, but also meat that is frozen and then thawed is not preferred by many customers, resulting in additional drawbacks to freezing excess product. A value or other indicator of the preference of customers for fresh meat over meat that is frozen and thawed may be referred to as freshness quotient. By way of example only and not by way of limitation, a freshness quotient of three days may be used for fresh meat. Continuing with this example, when the fresh meat is not consumed within three days, the three-day-old meat is pushed to frozen inventory. In one embodiment, the freshness quotient provides for planning the sale of meat as frozen or as fresh, in domestic markets.

Figure 7:
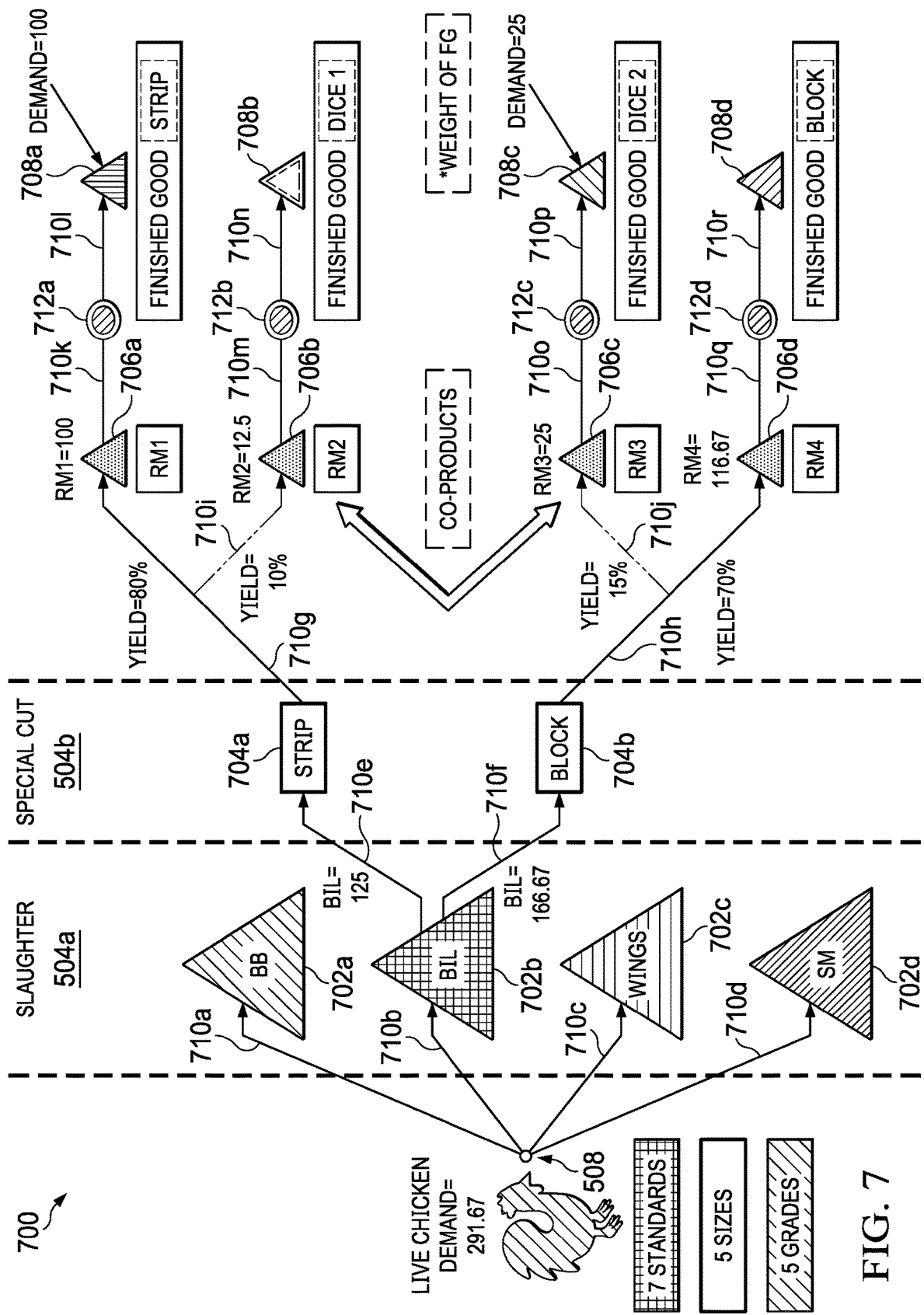
FIG. 7 illustrates a network model of meat processing, according to an embodiment.

FIG. 7 illustrates network model 700 of meat processing, according to an embodiment. Network model 700 represents processing activities beginning at the most upstream node (live animal 508) to more downstream nodes representing various parts of the animal at different levels of processing. Continuing with poultry processing example, network model 700 comprises live chicken at live animal 508, followed by four parts 702*a*-702*d* at slaughter level 504*a*; two cuts 704*a*-704*b* at special cut level, 504*b* and four final raw materials 706*a*-706*d* that are processed into four final products 708*a*-708*d*. Edges 710*a*-710*r* indicate production processes among the various levels of the nodes of network model 700. Each live animal 508 has certain standard, grade and size. Standard indicates the breed and the growth standards depending on the specifications set by a customer. Grade indicates the health of the chicken before slaughter. Size indicates the growth phase of the chicken. Every part that is sold has these attributes associated with it. Depending on the specification of the customer's demand, there exists a wide scope for substitution at every critical level of the BOM. Demands for final products 708*a*-708*d* may be satisfied by certain types of live animal 508. Standard grade size substitution 712*a*-712*d* represent these substitution points.

Although network model 700 is described as having a particular number of levels, parts, cuts, raw materials, and final products, network model 700 may comprise any suitable number of levels, parts, cuts, materials, products, and other supply chain components to model other production processes, according to particular needs. Network model 700 is for example only, network model of real-world poultry processors comprises many networks having a much larger number of parts, cuts, materials, and products. For example, if live animal 508 is available in, for example, seven standards, five sizes, and five grades, then production process represented by network model 700 comprises 175 options of live chicken at the first node. Continuing with the illustrated example, live animal 508 is followed by the four main parts of five piece 516: BB 702*a*; BIL 702*b*; wings 702*c*; and BIL 702*d*, at slaughter level 504*b*, as disclosed above. In this example, BIL 702*b* is processed by two cut types, strip 704*a* and block 704*b* at special cut level 504*b*. Continuing with this example, a production process at special cut level 504*b* cuts BIL 702*b* into strips 704*a* to produce a raw material (RM1) 706*a* for Finished Good Strips 708*a*, but this process also produces a dice-shaped coproduct, the raw material (RM2) 706*b* used to produce Finished Good-Dice 1 708*b*. In addition, or as an alternative, a different process, block 704*b*, cuts BIL 702*b* into blocks to produce raw material (RM4) 706*d* for Finished Good Block 708*d*; however, block process 704*b* also produces a dice-shaped coproduct, raw material (RM3) 706c used to produce Finished Good-Dice 2 708*c*.

By way of further explanation and not by way of limitation, an additional example is provided for network model 700. In the illustrated example, the poultry processor receives a demand of 100 units for Finished Good Strips 708*a* and a demand of 25 units for Finished Good—Dice 2 708*c*. Because finished goods are sold by weight, solver 204 uses the production yield of RM1 706*a* and RM3 706*c* for each unit of BIL 702*b* (i.e. the percentage weight of each unit of raw material per each unit of part) to calculate the quantity of BIL 702*b* needed to produce sufficient quantities of RM1 706*a* and RM3 706*c* to satisfy the demands of Finished Good Strip 708*a* and Finished Good-Dice 2 708*c*. Continuing with this example, solver 204 calculates a result of 125 units of BIL 702*b* are needed to satisfy the demand of 100 units for Finished Good Strip 708a (yield of 80%, i.e. 100 units/80%=125 units) and 166.67 units of BIL 702b are needed to satisfy the demand of 25 units for Finished Good-Dice 2 708c (25 units/15%=166.67 units). Each live chicken (live animal 508) produces one unit of BIL 702b. Accordingly, solver 204 of supply chain planner 110 calculates that 291.67 units of live chicken (125 units+166.67 units=291.67 units) are needed to satisfy the demands for Finished Good Strip 708a and Finished Good-Dice 2 708c.

Figure 8:
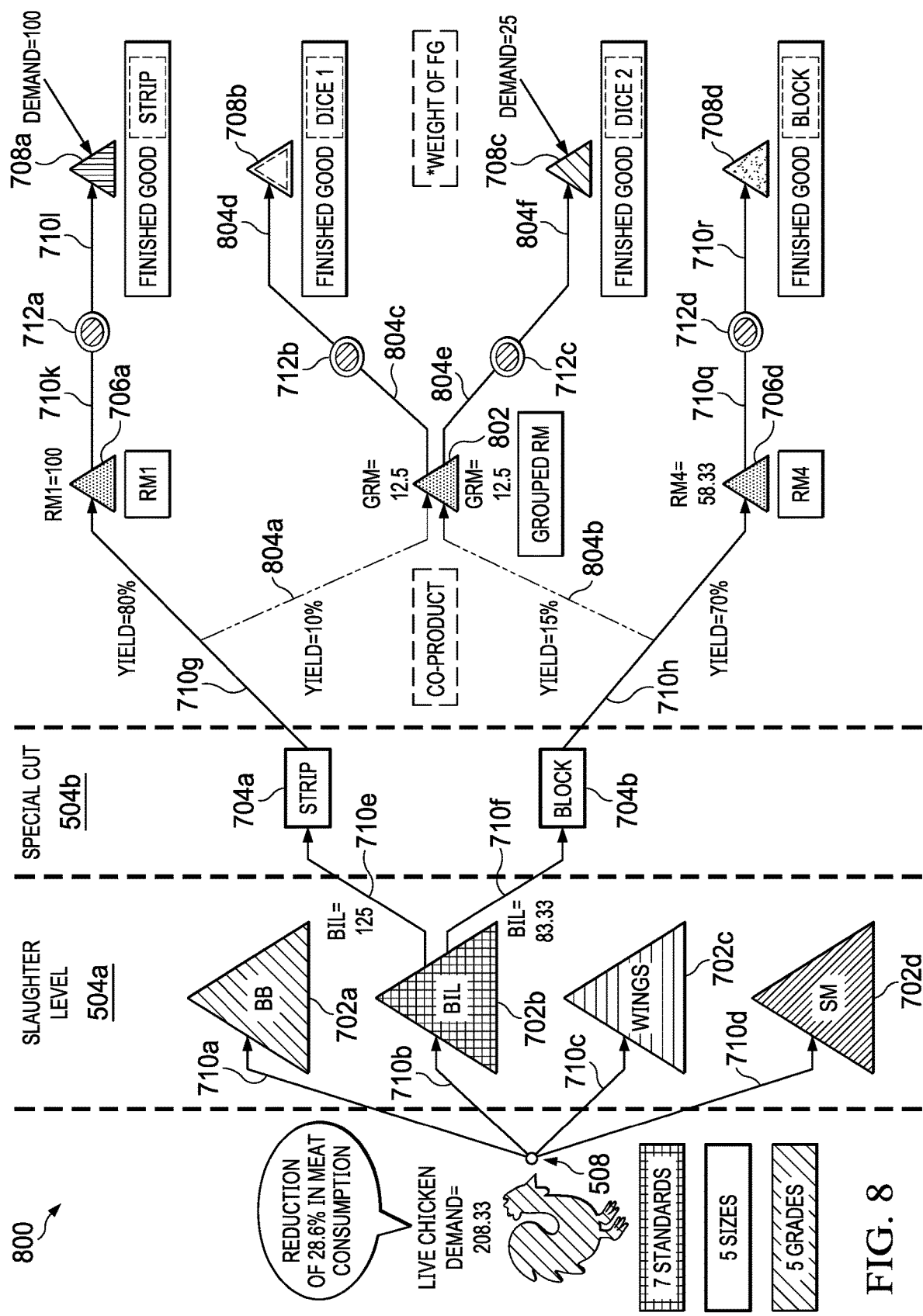
FIG. 8 illustrates a network model of meat processing after the BOM grouping method of FIG. 4, according to an embodiment.

FIG. 8 illustrates network model 800 of meat processing after BOM grouping method 400 of FIG. 4, according to an embodiment. As disclosed above, optimizing a meat processing process comprises generating weight-yield clusters of raw materials produced from the same part and having the same cut shape. As described in further detail below, the raw materials for Finished Good-Dice 1 708b and Finished Good-Dice 2 708c are produced from the same part (BIL 706b), have the same cut type (DICE (i.e. a cut type produced as a by-product/co-product of strip 704a for RM1 706a and block 704b for RM4 706d), and the yield percentage of each is relatively similar (10% and 15%, as compared with yield percentage of other meat processing products, as described in further detail below). Clustering module 206 uses weight-yield clustering (as disclosed at activity 408, above) to cluster RM 2 706b and RM 3 706c into the same cluster. BOM building module 208 generates a grouping that assigns a dynamic BOM grouping code, raw material grouping (GRM 802), to represent the grouping of RM2 706b and RM3 706c.

Applying BOM grouping method 400 to generate dynamic BOM GRM 802 to RM2 706b and RM3 706c results in a single demand unit of GRM 802 representing RM2 706b and RM3 706c and may update edges 804a-804f of network model 800 to represent the new routing. When calculating demand, solver 204 still calculates 125 BIL 706b are needed to satisfy the demand for Finished Good Strip 708a, but when calculating the demand for BIL to satisfy the demand for Finished Good-Dice 2 708c, solver 204 first satisfies demand from the coproduced raw material GRM 802. Using the coproduced GRM 802 to partially satisfy the demand for Finished Good-Dice 2 708c, solver 204 now calculates 83.33 BIL 706c are needed to produce enough GRM 802 to satisfy the demand of 25 units of Finished Good-Dice 2 708c. The resulting total quantity of the demand for BIL 706b is 208.33 units (125 units+83.33 units=208.33 units) which is 28.6% reduction of live chickens (live animal 508) needed to satisfy the same demand when not using BOM grouping method 400.

Transactions in meat processing are measured by weight. According to one embodiment, demand attributes are cut type (e.g. dice, strips, nuggets, etc.), dimensions (e.g. cut length*width*thickness), and part (e.g. the raw material part to be used (SM, BB, etc.). For each of the foregoing attributes, the dimension attribute comprises the greatest variation. Even a slight variation of length, width, or thickness results in a new product. Converting the dimension variable to another related dimension which can be easily measured and with better controlled ranges discretizes the dimension variable. Discretizing the dimension variable provides for classifying the pieces according to weight. In one embodiment, the weight of a piece is computed by multiplying the volume (Length×Width×Thickness) with the average density of the product.

As described in further detail below, each cutting process may result in more than one co-product. The yield of the co-products may, in turn, depend on the type of the cut, size of the product, dimensions of the cut, size of the product and the operation or resource used. By way of example only and not by way of limitation, resources for poultry processing may include manual operations, water jet operations, machine operations, etc. For a particular cut type, the yield of the co-products may vary by as much as ten-fold depending on the size of the chicken and the resource used. The weight and yield are important for BOM grouping. A weight yield map points to groups formed as cohorts, which prevents over- or under-fitting of groups. According to embodiments, over-fitting may results in no grouping whereas under-fitting may results in a poor plan estimates.

As disclosed above, BOM grouping comprises sorting raw materials produced as coproducts or byproducts according to a shared part type and cut type (for poultry processing optimization) followed by weight-yield mapping to identify clusters used to generate BOM groupings. Continuing with the example of poultry processing, supply chain planner 110 receives or determines values calculated or known from the production planning model, such as, for example, calculating yield, identifying the upstream part that produces each raw material, the cut type that is used to produce each finished good, the identity of coproducts and byproducts of production processes for each finished good, and one or more values of dimensions and/or weight of the finished goods. For example, in the network model, illustrated above, the known values include yield, part type, cut type, and the identity of coproducts and byproducts of production processes for each finished good. However, to identify that RM2 706b and RM3 706c could be replaced by dynamic BOM group GRM 802, supply chain planner 110 needs to determine whether RM2 708b and RM3 708c share the same weight-yield cluster. However, often one or more values are known, and one or more values are unknown for weights and dimensions of goods sharing a part type and cut type. Embodiments contemplate one or more of the following non-limiting scenarios: (a) weight value is present; (b) weight value is missing, and all dimension values are present; (c) weight value is missing, and thickness value is missing; (d) weight value is missing, and width value is missing; and (e) weight value is missing, and width value and thickness value are also missing.

FIG. 9 illustrates chart 900 for calculating missing values, according to an embodiment. Chart 900 provides several examples for calculating missing values according to one or more of the non-limiting scenarios disclosed above. Chart 900 comprises finished good identifier (Packaged FG) 902; intermediate good identifier (Intermediate FG) 904; length 906; width 908; thickness 910; weight 912; weight computation 914; and missing dimension 916 for nuggets (cut type 918) of various sizes (S, M, and L) as indicated by size classification 920. Packaged FG 902 represents a final sellable item, such as, for example, final products 708a-708d of FIGS. 7-8, above. Intermediate FG 904 represents an intermediate final good, such as, for example, raw materials 706a-706d of FIGS. 7-8, above.

For scenarios where only weight 912 is missing, clustering module 206 calculates weight 912 by multiplying the density with the volume described by the dimension values (e.g., length 906, width 908, and thickness 910.) For scenarios where one or more dimension values e.g., length 906, width 908, and/or thickness 910) are missing, clustering module 206 may use a best fit curve to calculate the missing values. According to one embodiment, clustering module 206 may extrapolate and maintain a best fit curve for length 906, width 908, and thickness 910, by special cut type 504b to identify the missing dimension values.

Using the values estimated for the missing dimensions using extrapolation from the best fit curve, weight 912 of the remaining finished goods are calculated using the density and the volume described by the missing and present dimension values.

FIG. 10 illustrates raw material weight-yield table 1000 according to an embodiment. Weight-yield table 1000 comprises raw materials 1002aa-1002ad having an identifier (raw material 1004), weight 1006, and yield 1008. Each raw material 1002aa-1002ad (R1-R30) is associated with a weight (W1-W30) 1004 and yield (Y1-Y30) 1008. Weight 1006 for each raw material 1002aa-1002ad is the weight of the finished good downstream from each raw material 1002aa-1002ad. As disclosed above, yield 1008 for each raw material 1002aa-1002ad from an upstream part is a quantity that is measured or estimated from real-world values. Clustering module 206 receives or calculates weight 1004 and yield 1006 for each raw material 1002aa-1002ad having the same part type and cut type.

Figure 11:
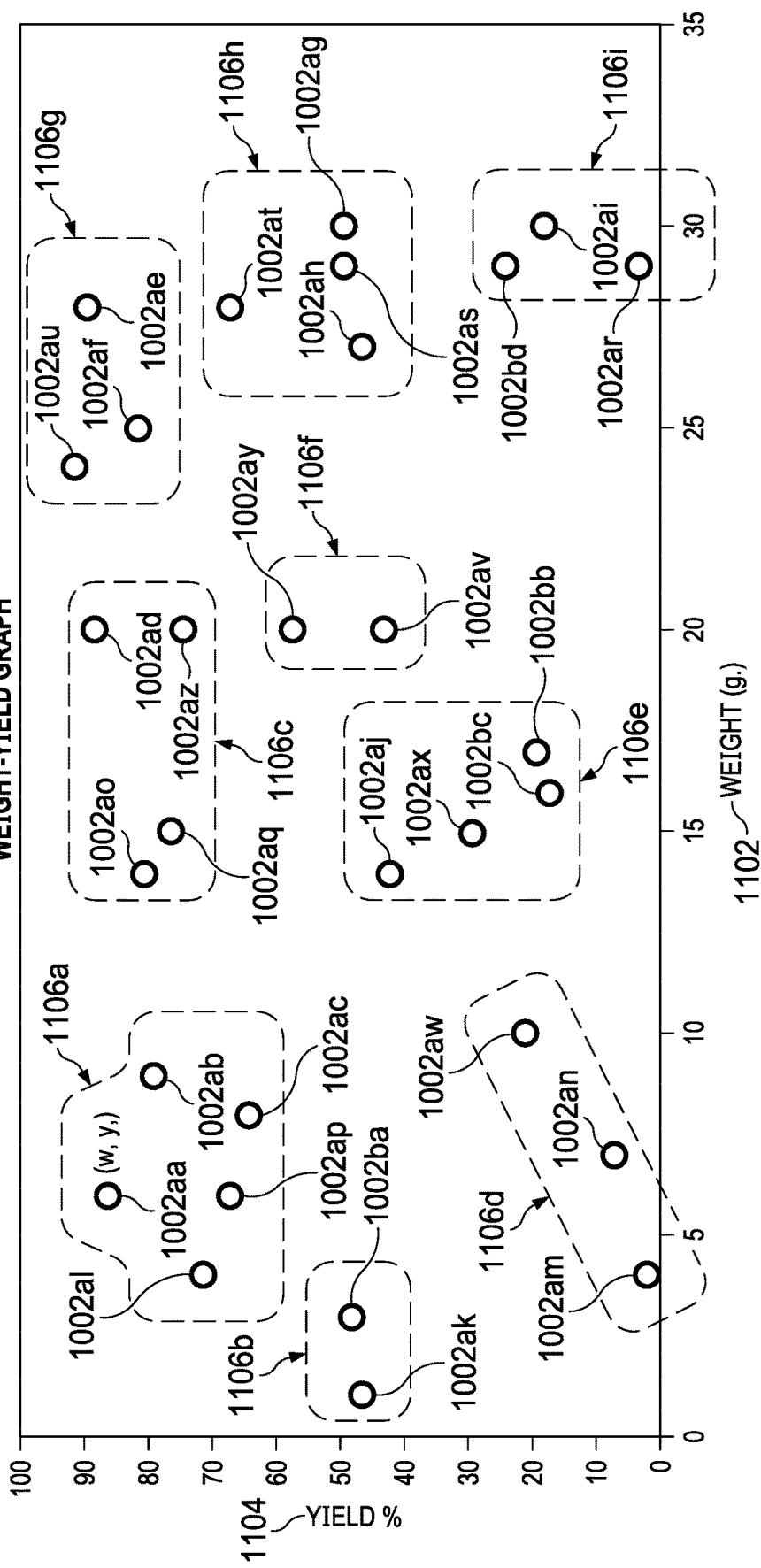
FIG. 11 illustrates a weigh-yield graph, according to an embodiment.

FIG. 11 illustrates weigh-yield graph 1100, according to an embodiment.

Weight-yield graph 1100 comprises plots of the (weight, yield)=($w_i$, $y_i$) of raw materials 1002aa-1002bd, which are raw materials used to produced finished goods that share the same part type and cut type, as disclosed above. Weight 1006 (in this example, expressed in grams) of raw materials 1002aa-1002bd is plotted along x-axis 1102, and yield % 1008 of raw material 1002aa-1002bd is plotted along y-axis 1104. Clustering module 206 calculates clusters 1106a-1106i using a clustering method, such as, for example, the K-means clustering method. According to embodiments, clustering module 206 receives or calculates the number of classes 'K' used for K-means clustering. According to the illustrated embodiment, the K value is nine, which signifies that K-means clustering will group raw materials 1002aa-1002bd according to the (weight, yield)=($w_i$, $y_i$) of the raw materials into nine clusters 1106a-1106i. Clustering module 206 generates clusters 1106a-1106i by initially selecting a random K number of centroids (W, Y), and then iteratively, calculating the Euclidean Distance from ($w_i$, $y_i$) to centroids (W, Y), clustering each raw material 1002aa-1002bd to the closest centroid (i.e., the minimum Euclidean Distance), and calculating a new mean (centroid) for each cluster 1106a-1106i, until the difference between the two consecutive iteratively calculated means is less than a predetermined tolerance value. When the difference between the two consecutive iteratively calculated means is less than a predetermined tolerance value, clustering method ends and the final clusters are used as clusters 1106a-1106i for generating discrete BOM groupings.

FIG. 12 illustrates chart 1200 of the discretized products generated from weight-yield mapping of clusters using BOM grouping method 400 of FIG. 4, according to an embodiment. BOM grouping method 400 of raw materials 1002aa-1002bd results in nine products 1202a-1202i, which represent nine clusters 1106a-1106i calculated by weight-yield clustering. Products 1202a-1202i represent each BOM group that replaces raw materials 1002aa-1002bd generated as coproducts and byproducts from the production of one or more other products. Raw materials 1002aa-1002bd classified by BOM grouping method 400 are used to produce finished goods 1202a-1202i from any of the other raw materials 1002aa-1002bd in the same BOM grouping represented by clusters 1106a-1106i. Chart 1200 indicates cutting group 1204, size 1206, minimum weight 1208, maximum weight 1210, minimum yield 1212, and maximum yield 1214 for each of grouped products 1202a-1202i.

Minimum weight 1208 and maximum weight 1210 and minimum yield 1212 and maximum yield 1214 indicate the range of the minimum and maximum weights and yields, respectively, of the raw materials in each of the clusters and form the basis of weight clustering and classification. For example, when cutting group 1204 is dice and weight is from zero to 1.67 grams and yield is from 0 to 33%, the raw material belongs in Small Dice 1.

BOM grouping for poultry processing begins with a blueprint of the particular type of bird (such as, for example, a chicken) from the whole chicken to its five main parts through the level of special cuts. Different sizes of chicken have different yield ratios of co-products (reverse BOM components) at every stage of cuts. The yields depend on the size of the whole chicken and the type of the cut. The BOM grouping method uses this as the template for creation of the BOM. Grouping and optimization, as disclosed above, are confined to special cut operations. Every demand placed by a customer has a specification code associated with it. The specification code comprises the cut type, cut-size, part-type, etc. Mapping this demand to one of the clusters created in special cut level 504b completes the supply chain linkage. When a customer's specification cannot be mapped to any of the existing clusters, the blueprint of the chicken may then be revised to cover the new specification.

FIGS. 13A and 13B illustrate Key Performance Indicators (KPIs) for two example scenarios, according to an embodiment. Chart 1300 comprises KPIs for the first scenario: fixed supply of chicken (kg) 1302a; purchase of live chickens (kg) 1302b; demand (kg) 1302c; demand satisfaction (kg) 1302d; resource utilization slaughter (h) 1302e; and resource utilization slaughter extension (h) 1302f (Slaughter extension is the level of BOM where type clustering is happening—in the chicken slaughter scenario, it may be represented by the stage where the five piece is further cut into dice, strips etc., downstream of the slaughter process.). With reference to KPIs 1302a-1302f for the scenario, a comparison between the KPI using BOM grouping method 400 (grouping 1304a) and without BOM grouping (no grouping 1304b) shows the quantity of live chickens needed to satisfy the demand 1302c of the farms is reduced by approximately 17%, resource utilization 1302e is decreased by approximately 15%, and demand satisfaction 1302d is significantly increased as well.

Chart 1310 comprises KPIs for the second scenario: fixed supply of chicken (kg) 1302a; purchase of live chickens (kg) 1302b; demand (kg) 1302c; demand satisfaction (kg) 1302d; excess (kg) 1312; resource utilization slaughter (h) 1302e; and resource utilization slaughter extension (h) 1302f. In the second scenario, represented by FIG. 13B, purchasing of live chickens is not allowed (i.e. the supply of live chickens is fixed). In this scenario, using the BOM grouping method increases demand satisfaction 1302d by approximately 21% while the inventory level (excess 1312) is significantly reduced.

Reference in the foregoing specification to "one embodiment", "an embodiment", or "some embodiments" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments have been shown and described, it will be understood that various changes and modifications to the foregoing embodiments may become apparent to those skilled in the art without departing from the spirit and scope of the present invention.

What is claimed is:

1. A system of supply chain planning of meat process industry production, comprising: a computer, comprising a processor and memory, the computer configured to:
    model a supply chain planning problem for two or more products of a meat process industry, wherein a coproduct is produced for at least one of the products;
    group the two or more products into groups, wherein the products in each of the groups share a same type of a first dimension;
    receive a weight and a yield for each raw material that produces each of the products in at least one of the groups; cluster each of the raw materials using weight-yield clustering;
    generate bill of material grouping based, at least in part, on the clustered raw materials;
    assign one bill of material grouping to each of the raw materials of a single cluster, wherein at least one finished good is produced from any of the raw materials assigned to the one bill of material grouping, and wherein the one bill of material grouping reduces a quantity of produced co-products, which reduces an amount of processed product that is wasted; and
    generate instructions based, at least in part, on the assigned one bill of material grouping, wherein the generated instructions instruct one or more automated machines to produce processed goods comprising one or more special cuts for a meat processor, and further wherein the generated instructions reduce an amount of meat that is wasted or placed in frozen storage.

2. The system of claim 1, wherein the computer is further configured to:
    group the products sharing the same type of the first dimension;
    group the products in each of the first dimension groups according to a second dimension; and
    calculate a demand quantity of a material in a supply chain, wherein the coproduct produced for the at least one of the products satisfies a demand for at least one of the finished goods.

3. The system of claim 1, wherein the computer is configured to cluster each of the raw materials using weight-yield clustering by:
    plotting the yield versus the weight for each of the raw materials in the at least one of the groups as a weight-yield plot;
    selecting an initial quantity of centroids for the weight-yield plots for the raw materials in the at least one of the groups;
    iteratively calculating a Euclidean distance from each weight-yield plot to each of the centroids;
    clustering each of the raw materials to a centroid of having the minimum Euclidean distance; and
    calculating a new centroid for each of the clusters until the difference between the two consecutive iteratively-calculated means is less than a predetermined tolerance value.

4. The system of claim 1, wherein the yield is the ratio of co-products determined by a reverse bill of material.

5. The system of claim 1, wherein the computer is further configured to:
    solve the supply chain planning problem using linear programming (LP) optimization.

6. The system of claim 2, wherein the supply chain is a meat processing supply chain, the first dimension is a part type and the second dimension is a cut type.

7. The system of claim 5, wherein the supply chain planning problem comprises at least one objective function, the at least one objective function is a WIP flush objective.

8. A method of supply chain planning of meat process industry production, comprising:
    modeling, by a computer comprising a processor and memory, a supply chain planning problem for two or more products of a meat process industry, wherein a coproduct is produced for at least one of the products;
    grouping, by the computer, the two or more products into groups, wherein the products in each of the groups share a same type of a first dimension;
    receiving, by the computer, a weight and a yield for each raw material that produces each of the products in at least one of the groups;
    clustering, by the computer, each of the raw materials using weight-yield clustering;
    generating, by the computer, bill of material grouping based, at least in part, on the clustered raw materials;
    assigning, by the computer, one bill of material grouping to each of the raw materials of a single cluster, wherein at least one finished good is produced from any of the raw materials assigned to the one bill of material grouping, and wherein the one bill of material grouping reduces a quantity of produced co-products, which reduces an amount of processed product that is wasted; and
    generating, by the computer, instructions based, at least in part, on the assigned one bill of material grouping, wherein the generated instructions instruct one or more automated machines to produce processed goods comprising one or more special cuts for a meat processor, and further wherein the generated instructions reduce an amount of meat that is wasted or placed in frozen storage.

9. The method of claim 8, further comprising:
    grouping, by the computer, the products sharing the same type of the first dimension;
    grouping, by the computer, the products in each of the first dimension groups according to a second dimension; and
    calculating, by the computer, a demand quantity of a material in a supply chain, wherein the coproduct produced for the at least one of the products satisfies a demand for at least one of the finished goods.

10. The method of claim 8, wherein clustering each of the raw materials using weight-yield clustering comprises:
    plotting the yield versus the weight for each of the raw materials in the at least one of the groups as a weight-yield plot;
    selecting an initial quantity of centroids for the weight-yield plots for the raw materials in the at least one of the groups;
    iteratively calculating a Euclidean distance from each weight-yield plot to each of the centroids;
    clustering each of the raw materials to a centroid of having the minimum Euclidean distance; and
    calculating a new centroid for each of the clusters until the difference between the two consecutive iteratively-calculated means is less than a predetermined tolerance value.

11. The method of claim 8, wherein the yield is the ratio of co-products determined by a reverse bill of material.

12. The method of claim 8, further comprising:
    solving, by the computer, the supply chain planning problem using linear programming (LP) optimization.

13. The method of claim 9, wherein the supply chain is a meat processing supply chain, the first dimension is a part type and the second dimension is a cut type.

14. The method of claim 12, wherein the supply chain planning problem comprises at least one objective function, the at least one objective function is a WIP flush objective.

15. A non-transitory computer-readable medium embodied with software, the software when executed:
models a supply chain planning problem for two or more products of a meat process industry, wherein a coproduct is produced for at least one of the products;
groups the two or more products into groups, wherein the products in each of the groups share a same type of a first dimension;
receives a weight and a yield for each raw material that produces each of the products in at least one of the groups;
clusters each of the raw materials using weight-yield clustering;
generates bill of material grouping based, at least in part, on the clustered raw materials;
assigns one bill of material grouping to each of the raw materials of a single cluster, wherein at least one finished good is produced from any of the raw materials assigned to the one bill of material grouping, and wherein the one bill of material grouping reduces a quantity of produced co-products, which reduces an amount of processed product that is wasted; and
generates instructions based, at least in part, on the assigned one bill of material grouping, wherein the generated instructions instruct one or more automated machines to produce processed goods comprising one or more special cuts for a meat processor, and further wherein the generated instructions reduce an amount of meat that is wasted or placed in frozen storage.

16. The non-transitory computer-readable medium of claim 15, wherein the software when executed further:
groups the products sharing the same type of the first dimension;
groups the products in each of the first dimension groups according to a second dimension; and
calculates a demand quantity of a material in a supply chain, wherein the coproduct produced for the at least one of the products satisfies a demand for at least one of the finished goods.

17. The non-transitory computer-readable medium of claim 15, wherein clusters each of the raw materials using weight-yield clustering comprises:
plotting the yield versus the weight for each of the raw materials in the at least one of the groups as a weight-yield plot;
selecting an initial quantity of centroids for the weight-yield plots for the raw materials in the at least one of the groups;
iteratively calculating a Euclidean distance from each weight-yield plot to each of the centroids;
clustering each of the raw materials to a centroid of having the minimum Euclidean distance; and
calculating a new centroid for each of the clusters until the difference between the two consecutive iteratively-calculated means is less than a predetermined tolerance value.

18. The non-transitory computer-readable medium of claim 15, wherein the yield is the ratio of co-products determined by a reverse bill of material.

19. The non-transitory computer-readable medium of claim 15, wherein the software when executed further:
solves the supply chain planning problem using linear programming (LP) optimization.

20. The non-transitory computer-readable medium of claim 19, wherein the supply chain planning problem comprises at least one objective function, the at least one objective function is a WIP flush objective.

* * * * *